US007009378B2

(12) United States Patent
Blake et al.

(10) Patent No.: US 7,009,378 B2
(45) Date of Patent: Mar. 7, 2006

(54) TIME DIVISION MULTIPLEXED OPTICAL MEASURING SYSTEM

(75) Inventors: Jame N. Blake, Paradise Valley, AZ (US); Farnoosh Rahmatian, Vancouver (CA); Allen H. Rose, Phoenix, AZ (US)

(73) Assignee: NxtPhase T & D Corporation, Vancouver (CA)

( * ) Notice: Subject to any disclaimer, the term of this patent is extended or adjusted under 35 U.S.C. 154(b) by 0 days.

(21) Appl. No.: 10/931,446

(22) Filed: Sep. 1, 2004

(65) Prior Publication Data

US 2005/0062460 A1 Mar. 24, 2005

Related U.S. Application Data

(60) Provisional application No. 60/500,665, filed on Sep. 5, 2003.

(51) Int. Cl.
*G01R 31/00* (2006.01)
(52) U.S. Cl. ......................................................... 324/96
(58) Field of Classification Search ...................... None
See application file for complete search history.

(56) References Cited

U.S. PATENT DOCUMENTS

| | | | | | |
|---|---|---|---|---|---|
| 4,939,447 | A | * | 7/1990 | Bohnert et al. | ................ 324/96 |
| 5,029,273 | A | * | 7/1991 | Jaeger | .......................... 324/96 |
| 5,059,894 | A | | 10/1991 | Miller | |
| 5,477,134 | A | * | 12/1995 | Hamada | ....................... 324/96 |
| 5,731,579 | A | * | 3/1998 | Woods | .......................... 324/96 |
| 5,892,375 | A | | 4/1999 | Vulih et al. | |
| 6,166,816 | A | * | 12/2000 | Blake | ..................... 250/227.27 |
| 6,252,388 | B1 | * | 6/2001 | Jaeger et al. | ................... 324/96 |
| 6,285,182 | B1 | * | 9/2001 | Blake et al. | .................... 324/96 |
| 6,362,615 | B1 | * | 3/2002 | Davidson et al. | .............. 324/96 |
| 6,380,725 | B1 | * | 4/2002 | Chavez et al. | ................. 324/96 |
| 6,492,800 | B1 | | 12/2002 | Woods et al. | |
| 6,621,258 | B1 | | 9/2003 | Davidson et al. | |
| 6,670,799 | B1 | | 12/2003 | Bull et al. | |
| 2003/0117125 | A1 | * | 6/2003 | Rahmatian et al. | ............ 324/96 |
| 2003/0117126 | A1 | * | 6/2003 | Rahmatian | .................... 324/96 |

OTHER PUBLICATIONS

Copy of: International Search Report: PCT/US 04/28412 (5 pages).

* cited by examiner

*Primary Examiner*—Vinh Nguyen
*Assistant Examiner*—Jermele Hollington
(74) *Attorney, Agent, or Firm*—Robert A. Pajak

(57) ABSTRACT

A time division multiplexed optical voltage measuring system includes an optical voltage sensing system module including, (i) a plurality of optical sensors where each sensor is responsive to an input interrogation light wave, and (ii) one or more optical outputs affected by sensed electric field thereat. The optical voltage sensing system module includes an optical circuit arrangement having (i) an input for receiving a module specific pulsed light wave derived from a primary pulsed light wave from a remote light source, and (ii) arranged such that each of the plurality of optical sensors receives an interrogation pulsed light wave. The optical circuit arrangement of the optical voltage sensing system module further includes at least one optical wave combiner for combining like-kind of outputs from all of the plurality of optical sensors. The optical circuit is arranged such that the pulsed light waves from the outputs of different optical sensors arrive at the optical wave combiner at differing times. In turn, the output of the combiner is passed to a detector and signal processor at a remote location for signal processing, and providing a measurement of the voltage intended to be measured. In a specific embodiment, each voltage sensing modules is arranged integral with a high voltage insulator column of a multi-phase power line system.

18 Claims, 13 Drawing Sheets

Input Fibers  Output Fibers

TIME DIVISION MULTIPLEXED OPTICAL MEASURING SYSTEM

RELATED APPLICATION

This application claims the benefit of priority pursuant to 35 USC 119 of provisional patent application Ser. No. 60/500,665, filed 5 Sep. 2003, the disclosure of which application is hereby incorporated in its entirety by reference herein.

FIELD OF THE INVENTION

The present invention relates generally to voltage measuring systems and methods. More specifically, the present invention is related to a method and system for measuring voltage or current of a high voltage power line employing the use of multiple optical sensors, particularly optical voltage or electric field sensors, and optical current sensors.

BACKGROUND OF THE INVENTION

Voltage sensors for high voltage power line systems may be realized by the use of one or more electric field sensors. Further, such electric field sensors may be optical electric field sensors. The advantages of employment of optical sensors in power line applications are well known. Specifically a very significant advantage is that when optical fibers are employed as the signal-carrying medium, information contained in an optical wave is generally not affected by the severe electrical environment found in the power line systems environment—i.e., the power station.

Examples of optical electric field sensors are shown and described in U.S. Pat. No. 6,252,388, entitled, "Method and Apparatus for Measuring Voltage Using Electric Field Sensors," and U.S. Pat. No. 6,380,725, entitled, "Voltage Sensor," both of which are incorporated herein by reference. As illustrated therein, one or more electric field sensors are placed within an insulator column extending between ground potential and the voltage to be measured. The positions of the electric field sensors may be chosen according to a Gaussian-quadrature formulation, and the electric field sensors may be placed within a resistive shield that acts to grade the electric field, smoothing out high spatial electric field variations which may be generated on the surface of the insulator in polluted and/or wet environments.

Further, an example of an optical electric field sensor employed as a voltage sensor is shown and described U.S. Pat. No. 4,939,447, entitled, "Fiber Optic Voltage Sensor", issued to Bohnert, et al, in which a voltage sensor uses multiple fiber-optic piezoelectric electric field sensors to measure voltage. Accuracy is obtained by the use of a plurality of sensors; to obtain reasonable accuracy 22 sensors connected in series were required.

Another example of an optical electric field sensor is a Pockels cell for measuring voltage, particularly high voltage, as taught in U.S. Pat. No. 5,477,134, entitled, "Voltage Sensor For Use In Optical Power Transformer Including A Pair Of Pockels Cells, issued to Hamada," and U.S. Pat. No. 5,731,579, entitled, "Electro-Optical Voltage Sensor Head," issued to Woods, both of which are herein incorporated by reference thereto. Pockels cells may be constructed in the form of an integrated optics Pockels cell such as that described in U.S. Pat. No. 5,029,273, entitled, "Integrated Optics Pockels Cell Voltage Sensor," issued to Jaeger, which is also incorporated herein by reference thereto.

As is well understood in present day three-phase power stations, commonly there are three insulator columns, each of which includes a voltage transformer for deriving an indication of voltage of the high voltage on the power line. Analogously, electric field sensors may replace the voltage transformers for deriving a measurement of the power line voltage. If multiple electric field sensors are employed in each insulator column to derive the power line voltage associated with a single power line, each of the sensors must be interrogated to determine the strength of the electric field across the corresponding electric field sensor. In the scenario where optical electric field sensors are employed, the interrogation is accomplished by observing the behavior of optical waves in the presence of an electric field at the specific sensor location. In the following exposition, it should be assumed that the electric field sensors are optical electric field sensors.

Generally, associated with each optical electric field sensor is a remote dedicated electronic/optical sensor circuit module that receives an optical signal from a respective one of the optical electric field sensors that may form, in part, an array of electric field sensors intended to measure voltage associated with one phase of a three-phase power line system. The circuit module generally may include (i) a light source for delivering a light wave to the sensor, and a pair of combination optical signal detectors and signal converters for converting a pair of optical signals associated with a sensor into a pair of electrical signals for subsequent signal processing. It should be understood that the aforesaid sensor circuit module may be implemented on one circuit card, or may alternatively be on a circuit card embodying multiple sensor circuit modules or other electronic circuits or circuit modules.

Before proceeding, it should be recognized that preferably, to realize a voltage sensor, the aforesaid pair of electrical signal outputs from the converter may be combined by way of a signal processor for estimating the total voltage across the insulator using a selected optical signal algorithm, i.e., sums the results of multiple optical electric field sensors (e.g., three as will be assumed in the following exposition) in accordance with an algorithm, e.g., selected weighting of the multiple electric field sensors as taught in the aforementioned U.S. Pat. No. 6,252,388.

Of course, numerous control and characterization algorithms may be utilized in the processing of the raw optical signals, and corresponding detector output electrical signals, in the computation of the final voltage measurement. These algorithms may accomplish temperature characterization and also correct for a host of other optical/electrical/mechanical component parameter changes.

The total amount of electronics and fiber optic links required to realize a power line voltage sensor employing multiple optical electric field sensors can be a basic shortcoming of the prior art depending on the particular implementation. For example, as taught in the aforementioned power line voltage sensors, one input fiber and two output fibers will generally be required for each of three optical electric field sensors, leading to nine (9) optical fiber links per voltage sensor, or 27 fiber links for a three phase system. Such a system may then require three sensor circuit modules, one associated with each of the three electric field sensors, in the example, plus one additional circuit module for signal processing that performs, in part, the signal combining functions.

It should be recognized, however, that one way to reduce the number of optical fibers in the just described system, as well as the number of circuit modules, is to cascade the sensors—passing a light wave successively through multiple sensors. This arrangement has been mentioned in the aforerecited U.S. Pat. Nos. 6,252,388 and 6,380,725, however, such an arrangement is difficult to implement and has various limitation and restrictions.

It should be further noted that (i) one electronics board or circuit card (or equivalent electronic hardware) is generally required for each of the multiple optical electric field sensors (e.g., three)—each possibly containing a light source, and (ii) a dedicated optical signal combiner circuit card or module (or equivalent circuit) for summing the results of the optical electric field sensors. Thus, four dedicated electronic circuits or electronic cards would be required for each voltage sensor employing three optical electric field sensors, or 12 dedicated electronics circuits or electronic cards would be required for a three-phase system.

Accordingly, there is a need for a method and apparatus for minimizing the number of dedicated electronic circuits and/or circuit cards, and reducing the number of optical fiber links and number of electronics boards, while keeping the basic architecture of using multiple appropriately weighted electric field sensors to estimate power line voltage—i.e., across the high voltage insulator column from the power line to ground, particularly for one phase of a three-phase power line system.

SUMMARY OF THE INVENTION

An object of the present invention is to provide a voltage measuring system and method for measuring power line voltage employing optical electric field sensors with a minimal number of dedicated electronic circuits and/or circuit cards, and reducing the number of optical fiber links and number of electronics boards, while keeping the basic architecture of using multiple appropriately combined (e.g., weighted) optical electric field sensors to estimate power line voltage.

A time division multiplexed optical voltage measuring system in accordance with the present invention includes an optical voltage sensing system module including, (i) a plurality of optical sensors where each sensor is responsive to an input interrogation light wave, and (ii) one or more optical outputs affected by sensed electric field thereat. The optical voltage sensing system module includes an optical circuit arrangement having (i) an input for receiving a module specific pulsed light wave derived from a primary pulsed light wave from a remote light source, and (ii) arranged such that each of the plurality of optical sensors receives an interrogation pulsed light wave. The optical circuit arrangement of the optical voltage sensing system module further includes at least one optical wave combiner for combining like-kind of outputs from all of the plurality of optical sensors. The optical circuit is arranged such that the pulsed light waves from the outputs of different optical sensors arrive at the optical wave combiner at differing times. In turn, the output of the combiner is passed to a detector and signal processor at a remote location for signal processing, and providing a measurement of the voltage intended to be measured. In a specific embodiment, each voltage sensing modules is arranged integral with a high voltage insulator column of a multi-phase power line system.

In another embodiment of the present invention, an optical signal management router includes (i) an optical circuit arrangement having one or more optical splitters for routing a portion of a primary pulsed light wave to a plurality of voltage sensing modules each associated with an insulator column so that the module specific pulsed light wave arrives at differing times, and (ii) one or more optical signal combiners for combing outputs from each of the optical sensors of all of the voltage sensing modules so as to be routed to either a singular detector or dual detector system and accompanying signal processor for providing a signal represented of the voltage intended to be measured at each of the insulator columns.

DETAILED DESCRIPTION OF THE INVENTION

Figure 1:
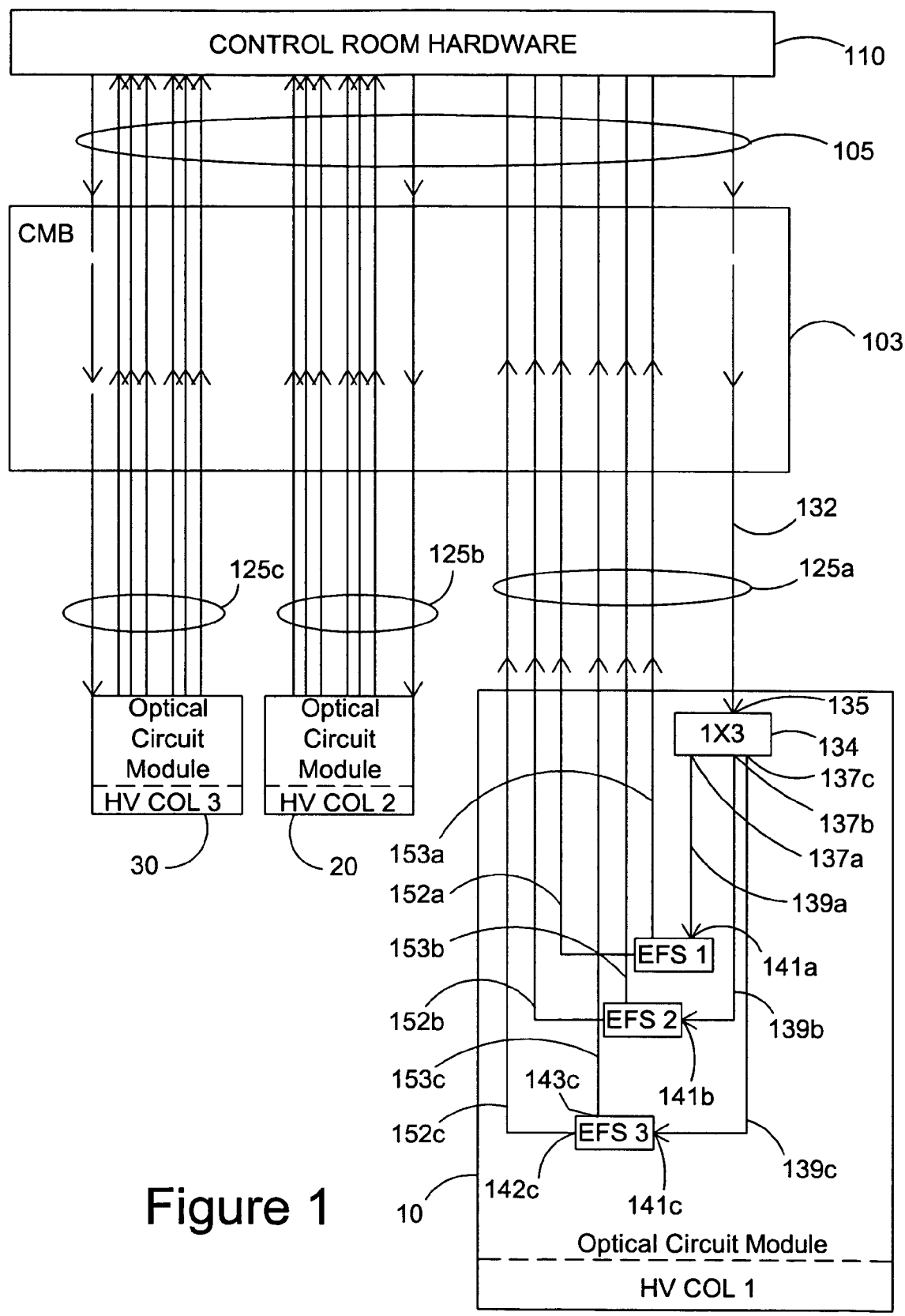
FIG. 1 is a schematic block diagram of a voltage sensing system for a three-phase power line system, where a power line voltage sensor associated with one high voltage insulator column employs a plurality of optical electric field sensors individually interrogated by an optical signal.

Illustrated in FIG. 1 is a simplified schematic block diagram of a voltage sensing system for a three-phase power line system of a complex optical and electronic system in accordance with one aspect of the present invention. In conventional systems, a high voltage insulator column is associated with each transmission line of a three-phase power system. Further, associated with each insulator column is an individual voltage sensing system for sensing the voltage of the particular transmission line coupled to the insulator column. As illustrated in FIG. 1, three identical individual high voltage columns are designated HV Col 1, HV Col 2, and HV Col 3 having corresponding high voltage sensing systems or voltage sensors 10, 20 and 30 respectively.

The present invention is particularly applicable to optical high voltage sensing systems or sensors where each voltage sensing system associated with each individual high voltage insulator column employs a plurality of optical electric field sensors individually interrogated by an optical signal. Here, and in some of the following illustrations, details of the optical circuit of only one of the high voltage sensing systems, e.g., 10, associated with one insulator columns (HV Col 1) is illustrated. Hereafter, the optical high voltage sensing systems, 10, 20 and 30 associated with each insulator column respectively will be referred simply as a voltage sensor.

It should also be appreciated that commonly an insulator column and accompanying voltage senor is intended to measure the power line voltage associated with one phase of the three phase system relative to ground. However, in some circumstances and applications it may be desirable to measure the voltage between two power lines, i.e., two phase of the three phase power line system as well understood. In the following exposition these two possible scenarios will be assumed although the description and accompany claims may refer only to the line to ground voltage associated with the insulator column.

Again referring to FIG. 1, control room hardware or controller 110 is illustrated separated from the high voltage insulator columns, hereafter simply as a column, so as to be located in a more benign environment as opposed to the high voltage environment of the power lines and insulator columns. Controller 110 is intended to serve as an optical signal controller and signal processor for providing an output signal indicative of the voltage intended to be sensed by each of the voltage sensors associated with each of the columns. More specifically, controller 110 serves to generate and receive optical signals through a cable management box 103, also designated "CMB," and subsequently routed to the individual optical voltage sensors associated with the individual columns.

Cable management box 103 is generally an input/output optical cable management connector box which may include additional optical circuitry, and is generally located at a lower end of one or each of the insulator columns as the configuration requires. A control room (not shown) remote from the insulator column generally houses controller 110 including optical and electrical circuitry—herein referred to as "Control Room Hardware," including among others, a light source, photo detectors, electric signal and data processors, and the like. Cable management box 103 as illustrated, and those that follow, serve as an optical signal management router that receives optical signals from the voltage sensors associated with the insulator columns and routes them to the remote control room as desired.

"VT trunk cable" 105 depicted in FIG. 1 represents one or more trunk cables or bundles that route the optical cables, i.e., optical fibers, between cable management box 103 and the control room hardware 110. Selected optical feeder cables 125a, b, and c are routed from the cable management box 103 to each of the insulator columns, and corresponding voltage sensors 10, 20, and 30, respectively. Appropriate input/output connectors (not shown), e.g., ferrule type connectors or splices, may be employed to minimize any stress on or damage to the optical fibers routed into and out of the various components.

In the exemplary embodiment illustrated in FIG. 1, each voltage sensor, 10, 20, and 30, associated with each respective insulator column includes an optical electric field sensor array employing three optical electric field sensors, EFS-1, EFS-2, and EFS-3. Of course, more or fewer optical electric field sensors may be employed as desired. For ease in understanding the present invention depicted in FIG. 1, input and output optical fibers and connections associated with sensor EFS-1 have the "a" designation, and designations "b" and "c" refer to sensors EFS-2 and EFS-3, respectively. Further, optical sensor connections associated with sensor EFS-1 will be illustrated in more detail than the others so as not to clutter the drawing with more detail than necessary, understanding that optical connections to the other two sensors, as illustrated, are similar.

In the illustrations that follow, single mode or multimode fibers may route optical signals from the control room hardware 110 to each of the EFS sensors. Single mode and/or Multimode fibers may route optical output signals from the EFS sensors to the control room through possibly various different kinds of single mode and/or multimode optical fibers and combiners where multiple optical pulses are merged into a single output optical signal. It should be noted that the choice of fiber is a matter of design choice, specifically the core and overall diameter parameters depending upon cost versus size and optical loss considerations. In an exemplary embodiment, the light source, generally physically located in the control room, may be one that is continuously on, or selectively switched to provide appropriate pulses, and may be chosen from a wide variety of components to provide the intended function.

As illustrated in the exemplary embodiment of FIG. 1, each of the electric field sensors (EFS) include (i) an input terminating end 141 for coupling an optical fiber thereto, and (ii) a pair of output terminating ends 142 and 143, having optical fibers 152 and 153, coupled thereto, respectively (the "a" designation referring to sensor EFS-1). In turn, these optical fibers 152 and 153 are routed to controller 110 through cable management box 103 and trunk cable 105. It should be noted that the optical electric field sensors depicted in the exemplary embodiment of FIG. 1 responds to a single mode input optical wave, the interrogator light wave, and provides a pair of optical waves each having a different orthogonal polarization state that is affected by the presence of any electric field as is well understood by those skilled in the art, the details thereof being omitted herein.

Further, in accordance with the present invention, each voltage sensor includes a 1×3 optical wave splitter 134 having (i) an input terminating end 135 for receiving an optical fiber 132 routed from the controller 110 through the cable management box 103, and (ii) three output terminating ends 137a,b, and c, having a respective optical fiber 139a, b, and c, coupled thereto at one end, and the other end thereof coupled to a respective input terminating end 141a, b, and c of electric field sensors EFS-1, EFS-2, and EFS-3, respectively.

Referring again to FIG. 1, each voltage sensor system associated with each insulator column includes a 1×3 splitter 134, and a continuously operated light source is applied to all three EFS sensors through single mode fibers. Each of the EFS sensors is interrogated and provides two polarization specific outputs for subsequent routing to the control room hardware for subsequent signal processing in order to provide an indication of estimated voltage associated with each of the insulator columns with a power line voltage coupled thereto. As may be easily seen by inspection of FIG. 1, a three phase power system would require 21 optical fibers routed into and out of controller 110, where each voltage sensor associated with each insulator column requiring 7 optical fibers associated therewith.

Figure 2:
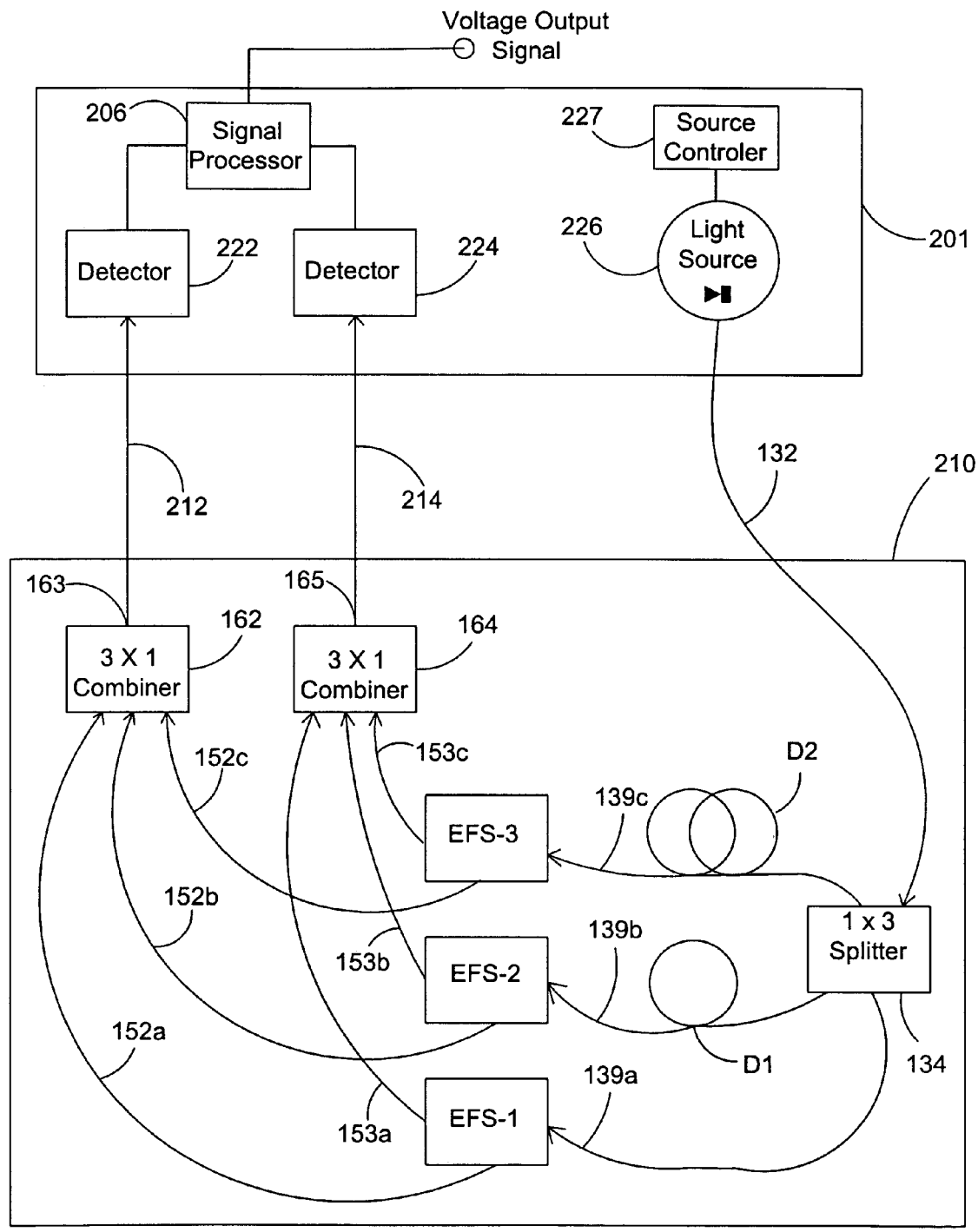
FIG. 2 is a simplified schematic block diagram of a time division multiplexed voltage sensing system for a single power line voltage sensor employing one embodiment of the system and method of the present invention.

Illustrated in FIG. 2 is a simplified schematic block diagram of one embodiment of a time division multiplexed optical voltage sensor and control room hardware, in accordance with the present invention, that may be substituted for each of the voltage sensors of FIG. 1. In FIG. 2, like components serving the same function as those in FIG. 1 have retained the same numeral designations in FIG. 2.

As illustrated in FIG. 2, controller 201 includes a signal processor 206 responsive to electrical output signals from optical detectors/converters 222 and 224. Detectors 222 and 224 receive optical signals on optical fibers 212 and 214 respectively, through a possible cable management box not shown. An optical source 226 conditionally controlled by source controller 227 provides an output optical wave on optical fiber 132 having selected characteristics, e.g., intensity, continuous on, pulsed, and selective pulsed duty cycle.

The high voltage sensing system or sensor 210 that may be substituted for sensor 10 in FIG. 1, also includes optical electric field sensors EFS-1, EFS-2, and EFS-3 as before, and also 1×3 splitter 134. However, in FIG. 2, each sensor EFS-2 and EFS-3 is coupled to a respective output of splitter 134 through optical light wave delays D1 and D2 respectively. Further, an output of each of the sensors EFS-1, EFS-2, and EFS-3 having one polarization state is coupled into a 3×1 optical combiner 162 through optical fibers 152a–c, respectively; and another output thereof of the other polarization state is coupled into a 3×1 optical combiner 164 through optical fibers 153a–c, respectively. The respective optical outputs 163 and 165 of combiners 162 and 164, respectively is coupled to detectors 222 and 224 through optical fibers 212 and 214, respectively.

The high voltage sensing system of FIG. 2 operates as follows. Light source 226 is operative to emit a primary pulse of light having a selected pulse width and duty cycle. This primary pulse of light is routed through single-mode fiber 132 to the 1×3 optical beam splitter 134. There the energy of the primary pulse of light is divided, and passes from the 1×3 optical beam splitter 134, generally equally onto three single-mode fibers 139a–c, each coupled into one of the three optical electric field sensors (EFS) respectively. Optical delay lines D1 and D2, imposing differing delays, are added to the corresponding optical feeder fibers 139b and 139c that are coupled to the optical electric field sensors EFS-2 and EFS-3, respectively. In turn, the light pulses that individually interrogate the three electric field sensors arrive at the pair of 3×1 optical signal combiners 162 and 164 at separate times, signal combiner 162 receiving lights pulses of one polarization state, and signal combiner 164 receiving lights pulses of another polarization state.

Before proceeding it should be noted that the simplest form of delay comprises an additional length of fiber such that the three optical fibers 139a–c have differing lengths in order to impose an optical light wave delay. It should of course be recognized that other delay techniques may be substituted herein, for example bulk optics and the like, and are considered to be within the true spirit and scope of the present invention.

The 3×1 combiner optical output signals corresponding to each of the sensor polarizations are routed through optical fibers 212 and 214 to impinge upon a corresponding photodetector 222 and 224, respectively, to generate a corresponding photodetector electrical output signal. In turn, these photodetector electrical output signals may then be digitized for subsequent signal processing—signal processor 206. Since the information from the three sensors may be sorted out according to pulse arrival time, the three sensors may be algorithmically combined in accordance with a pre-selected algorithm or weighting function—i.e., individually compensated and weighted within the digital signal processor. Of course, the signal processing may be done first separately by polarization or may be combined together. In turn, the same digital signal processor may be used to sum the resultant signals to give an output representing the voltage intended to be sensed—the voltage across the insulator column.

An implementation of a 3×1 combiner (162, 164) may be one that optically adds light waves from three separate input fibers and couples the result into a single output and associated output optical fiber. However, it may be desirable that the output fiber core should be significantly larger than the input fiber cores, to minimize light loss. Also, a loss of power may still be permissible as long as some light makes it to the photo-detector from each sensor output. The exact amount of light required is a design optimization issue only. Of course, generally, the more, the merrier (lower loss is better). Of course, the fiber and optical mode sizes of the input and outputs of the 3×1 (or any other Y×1) combiners have to be chosen to limit optical losses at the combiners so that sufficient light from every sensor reaches the photo-detector(s). The amount of sufficient light depends on the design of the electronics and the required Signal-to-Noise Ratio (SNR) for the system.

In an exemplary design, the optical delay line D1 delays the arrival of the interrogator optical pulse by one pulse width of the primary pulsed optical source 226, and the optical delay line D2 delays the interrogator optical pulse by two times the primary pulse width. Accordingly, three sequential optical pulses arrive at each optical signal detector 222 and 224 through the corresponding combiner 162 and 164, respectively. The first occurring light pulse at each detector gives information about sensor EFS-1, the second occurring light pulse at each detector gives information about sensor EFS-2, and the third occurring light pulse gives information about sensor EFS-3. Here sensors EFS-1, EFS-2, and EFS-3 may correspond to a series of optical electric field sensors in a high voltage column where EFS-1 is the top most sensor, and EFS-3 is the lowest most sensor. In accordance with a preferred method of operation, light source 226 is successively pulsed, and the three sensors give back their information in well-defined time slots corresponding to the three optical electric field sensors and known delay lines.

In practice as indicated above, each of the optical electric field sensors may be constructed to actually produce two optical signal outputs, each corresponding to one of two polarizations. It is well known in the art that the additional information supplied by the orthogonal polarization state outputs of polarimetric optical electric field sensors allows for further processing and characterization of the signal for error correction and temperature characterization. In accordance with the present invention, two 3×1 optical combiners 162 and 164 are employed to capture optical information associated with each of the optical electric field sensor orthogonal polarizations, although only one may be employed as desired depending upon the desired performance characteristics.

It should be recognized that the aforesaid electric field sensors may be constructed so as to have more than the two outputs as described in preceding description. Accordingly, the number of optical signal combiners, the size of the combiner, the number of detectors, and the number of routing fibers would, of course, depend on the type and number of optical electric field sensors, all of which are intended to be within true spirit and scope of the present invention.

Figure 3:
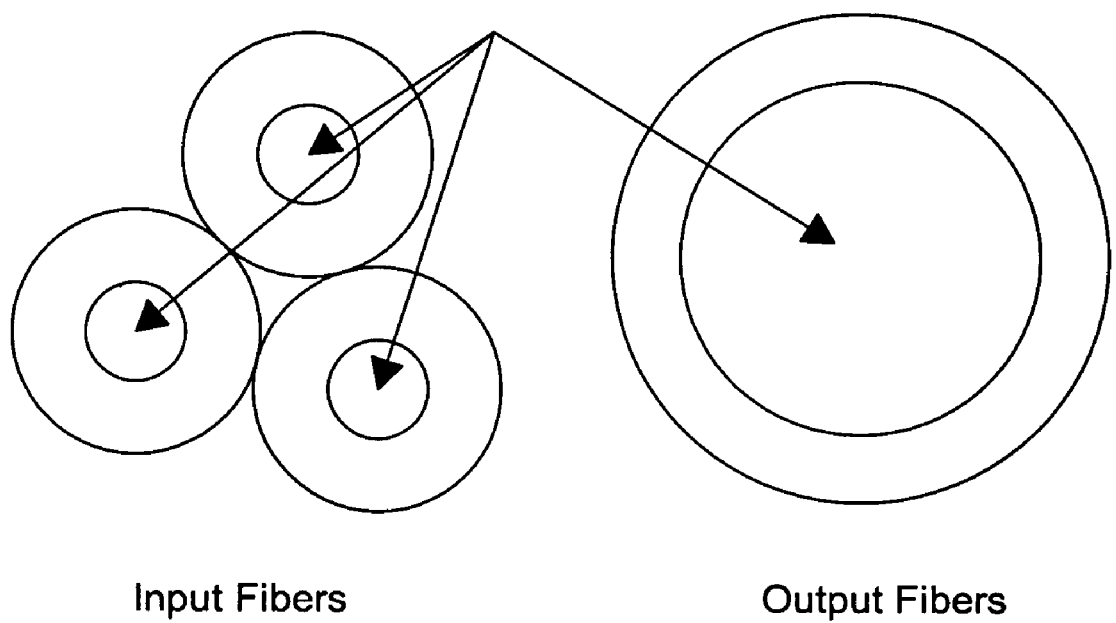
FIG. 3 is schematic diagram depicting optical fiber cross-sections and the relationship between input fibers to a multimode 3×1 optical combiner and associated output fiber.

In one embodiment of the present invention, the two optical fibers coupled to the two polarization outputs of the sensor are preferably multimode fibers, and the output fiber, i.e., 212 and 214, of the combiner is preferably a super multi-mode optical fiber having a core area that encompasses the total area of the three multimode optical fiber input cores as illustrated in FIG. 3.

In another embodiment of the present invention, the two optical fibers coupled to the two polarization outputs of the sensor are single-mode fibers, and the output of the combiner is also single-mode optical fiber, resulting in typically ~>67% optical loss in the 3×1 single-mode combiner. An embodiment of this type is most likely simpler and cheaper, but may lead into poorer SNR and signal quality. However, it may be appropriate for many applications depending on cost-performance requirements.

The high voltage sensing systems of FIG. 2 has been described in the previous exposition where the light source pulse width is equal to the delay D1, and is ½ the delay D2. This choice cleanly separates the return pulses from the optical electric field sensors. Other choices are of course possible. For example, using the same delays D1 and D2, the light source pulse width could be doubled. Then the returning light would alternately be a combination of electric field sensors 1&2, 2&3, and 3&1. This configuration allows for double the total light usage, and no loss of information (each sensor is alternately unread instead of read). The net result may be better SNR and signal measurement signal quality.

The delay lines are shown as part of the single mode fiber inputs to the electric field sensors. Alternately, the delay lines could be added to optical multimode fibers coupled to the outputs of the electric field sensors (not shown). However, the drawback to this arrangement is that twice as many delay coils would be needed. On the other hand, a possible benefit to this arrangement is that all six multimode fibers returning from the sensors could be combined into one returning fiber, instead of the two fibers 212 and 214 as shown.

Figure 4A:
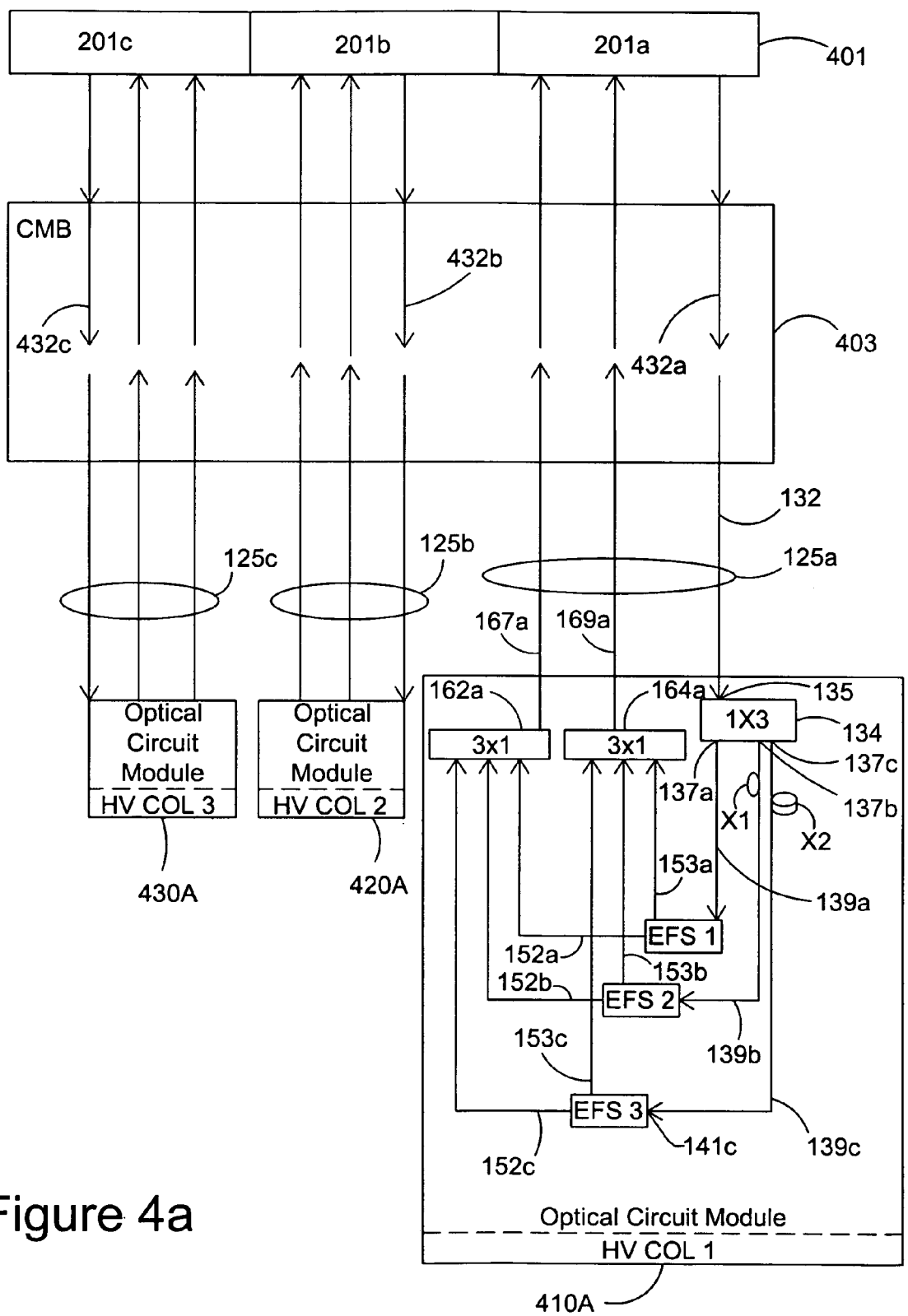
FIGS. 4a and 4b are schematic block diagrams of alternate embodiments of a 3-time-slot time division multiplexed voltage sensing system for a three-phase power line in accordance with the system and method of the present invention.
Figure 4B:
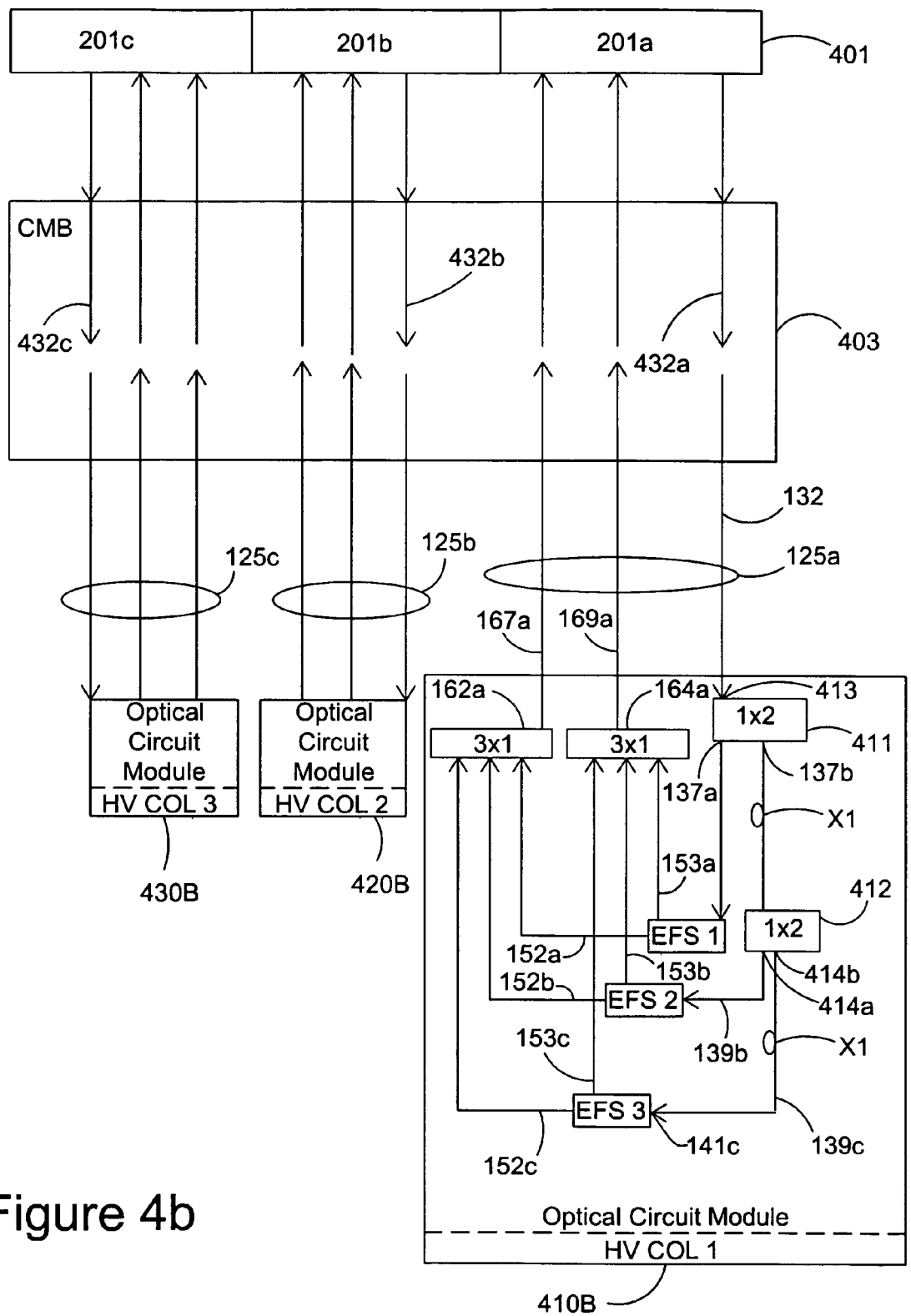

Illustrated in FIGS. 4a and 4b are schematic block diagrams of a voltage sensing system for a three-phase power line system employing another embodiment of the system and method of the present invention—two configurations of a 3-time-slot time multiplexed voltage sensor. As illustrated in FIGS. 4a and 4b, like that of FIGS. 1 and 2, each of the electric field sensors has two polarization specific outputs which are concurrently coupled to the control room hardware electronics 401 having three separate and substantially identical controllers 201a, 201b, 201c each being substantially identical to controller 201 illustrated in FIG. 2 including light source 226 and photodetectors/receivers 222, 224. Each voltage sensor associated with each insulator column requires one input optical fiber for receiving an input optical pulse, and two output optical fibers—the control room hardware 401 provides three discrete optical light waves (one to each voltage sensor), and receives 6 discrete optical signals (two from each sensor).

FIG. 4a illustrates a three-phase voltage sensing system where the voltage sensor of FIG. 2 is employed with each of the insulator columns, and designated in FIG. 4a as 410A, 420A, and 430A with control room hardware 401 including those components associated with each of the corresponding voltage sensors substantially identical to sensor 210 as already described. Combiners 162 and 164 are again illustrated in FIG. 4 with them being multimode combiners. Like FIG. 2, the voltage sensor 410 includes an input 1×3 splitter 135 for receiving a light pulse routed from controller 201a through cable management box 403 to the 1×3 splitter in voltage sensor 410a. One output of the 1×3 splitter is coupled to one EFS sensor through an optical fiber of known length L, another output is coupled to another EFS sensor through an optical fiber of known length L plus a delay line X1, and the last output is coupled to another EFS sensor through an optical fiber of known length L plus a delay line X2 inducing delay twice that of delay line X1. Accordingly, each of the EFS sensors of the optical circuit of the high voltage insulator column receives an interrogation optical pulse separated in time in relation to the selected length of optical delay line X1 and the speed of light in the optical fiber.

As before, each voltage sensor includes two 3×1 combiners 162 and 164 for receiving respective polarization specific optical output signals from each of the three EFS sensors. Each polarization state output of each of the optical electric field sensors is routed to the appropriate electronics of the control room hardware 401, specifically 201a, remotely located in a control room through one of the 3×1 multimode couplers. In the exemplary embodiment of FIG. 4a, there is one light source 226 associated with each voltage sensor, for example a LED light source in the order of 200 microwatts, with a pulse width of 3 micro-seconds and pulse repetition rate of 10 micro-seconds. Further, in the exemplary embodiment delay line X1 is in the order of 600m, and delay line X2 would be in the order of 1200 m.

Illustrated in FIG. 4b is an alternate configuration for achieving a 3-time-slot time multiplexed voltage sensor similar to that of FIG. 4a. In FIG. 4b, an alternate embodiment for voltage sensors 410A, 420A, and 430A, like that of FIG. 2, are designated as voltage sensors 410B, 420B, and 430B, respectively. Voltage sensor 410B, as illustrated in FIG. 4b, includes a 1×2 single mode splitter 411 that replaces 1×3 splitter 134 of voltage sensor 410A. Further, another 1×2 single mode splitter 412 and a pair of delay lines X1 replaces the arrangement of delay lines X1 and X2 of voltage sensor 410A.

In operation, splitter 411 receives a primary light pulse on optical fiber 132 routed from controller 201a through cable management box 403 to the first input 413 of 1×2 splitter 411 of voltage sensor 410B. One output of the 1×2 splitter 411 is coupled to sensor EFS-1 through an optical fiber of known length L1; the other output is coupled to the other 1×2 single-mode splitter 412 through a delay line X1 of known length. One output of the latter 1×2 splitter 412 is coupled to sensor EFS-2, and the other output thereof is coupled to the remaining one of the three EFS sensors, EFS-3, through another delay line X1.

With the proper selection of the length of optical fibers being routed from both 1×2 splitters 411, 412 to their respective EFS sensors, each of the EFS sensors of voltage sensor 410B receives an interrogation optical pulse separated in time in relation to the selected length of optical delay line X1 and the speed of light in the optical fiber. The 1×2 splitters need not be 50/50 splitters, they may be of other values based on the design requirement. For example, if we intend to send approximately equal amount of optical power to all three electric field sensor, the first 1×2 splitter 411 can be a 67/33 splitter (33% of light going to first electric field sensor and 67% of light going to the latter 1×2 splitter 412), and the latter 1×2 splitter 412 can be a 50/50 splitter.

As illustrated in FIG. 4*b*, the output of the three EFS sensors are routed to the control room hardware 401 in the same manner as that already described with reference to FIG. 4*a*. The configuration of FIGS. 4*a* and 4*b* are such that each optical circuit associated with the voltage sensor of each insulator column requires one input fiber connection and two output fiber connections, and associated with the control room hardware 110 are three output fibers for supplying an output optical pulse to the optical circuit of each of the voltage sensors 410, 420, and 430, and 6 input fiber connections, for receiving the two polarization specific optical signals from each of the voltage sensors, respectively, derived from their three EFS sensors associated therewith.

Figure 5A:
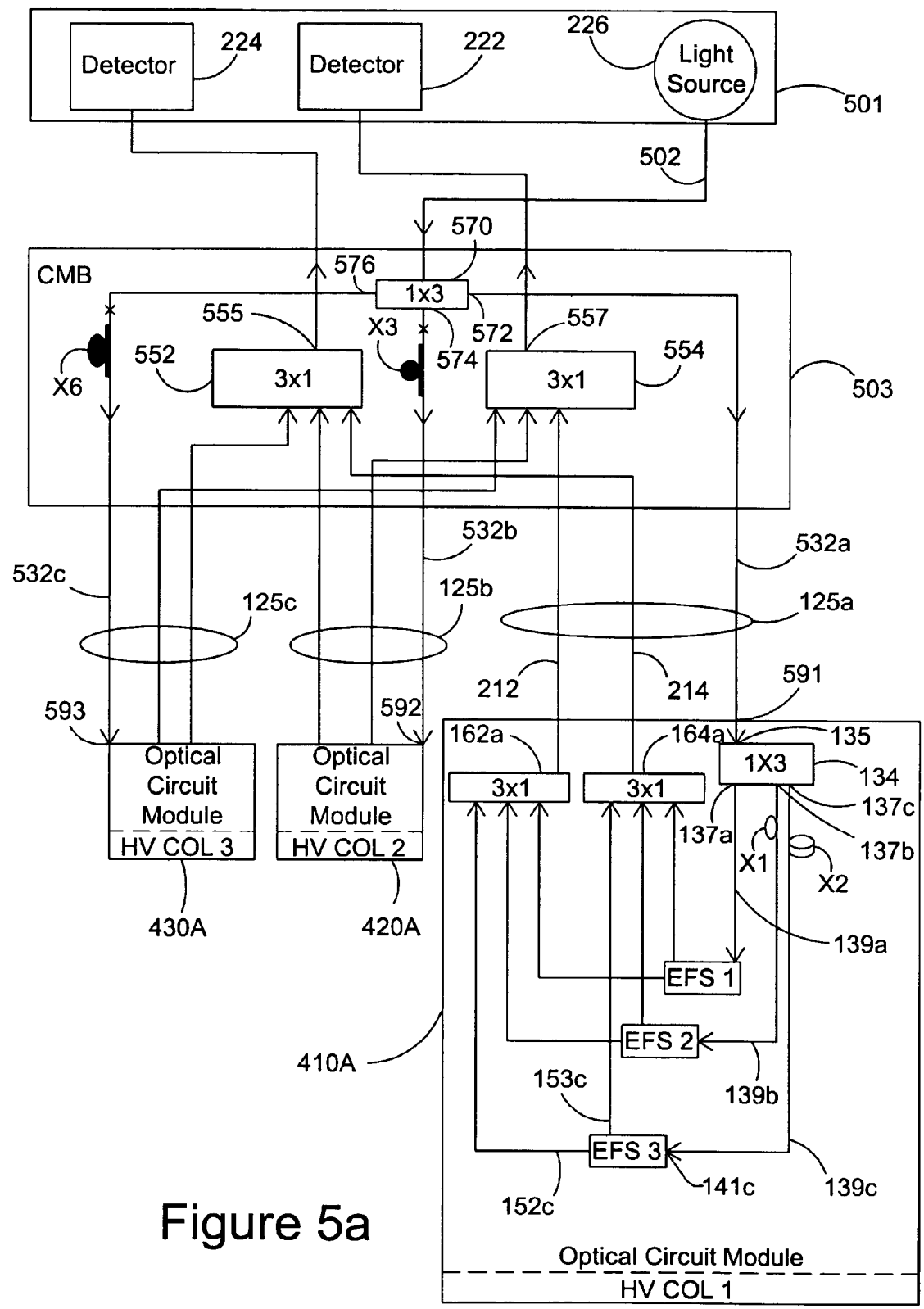
FIGS. 5a and 5b are schematic block diagrams of alternate embodiments of a 9-time-slot time division multiplexed voltage sensing system for a three-phase power line in accordance with the system and method of the present invention.
Figure 5B:
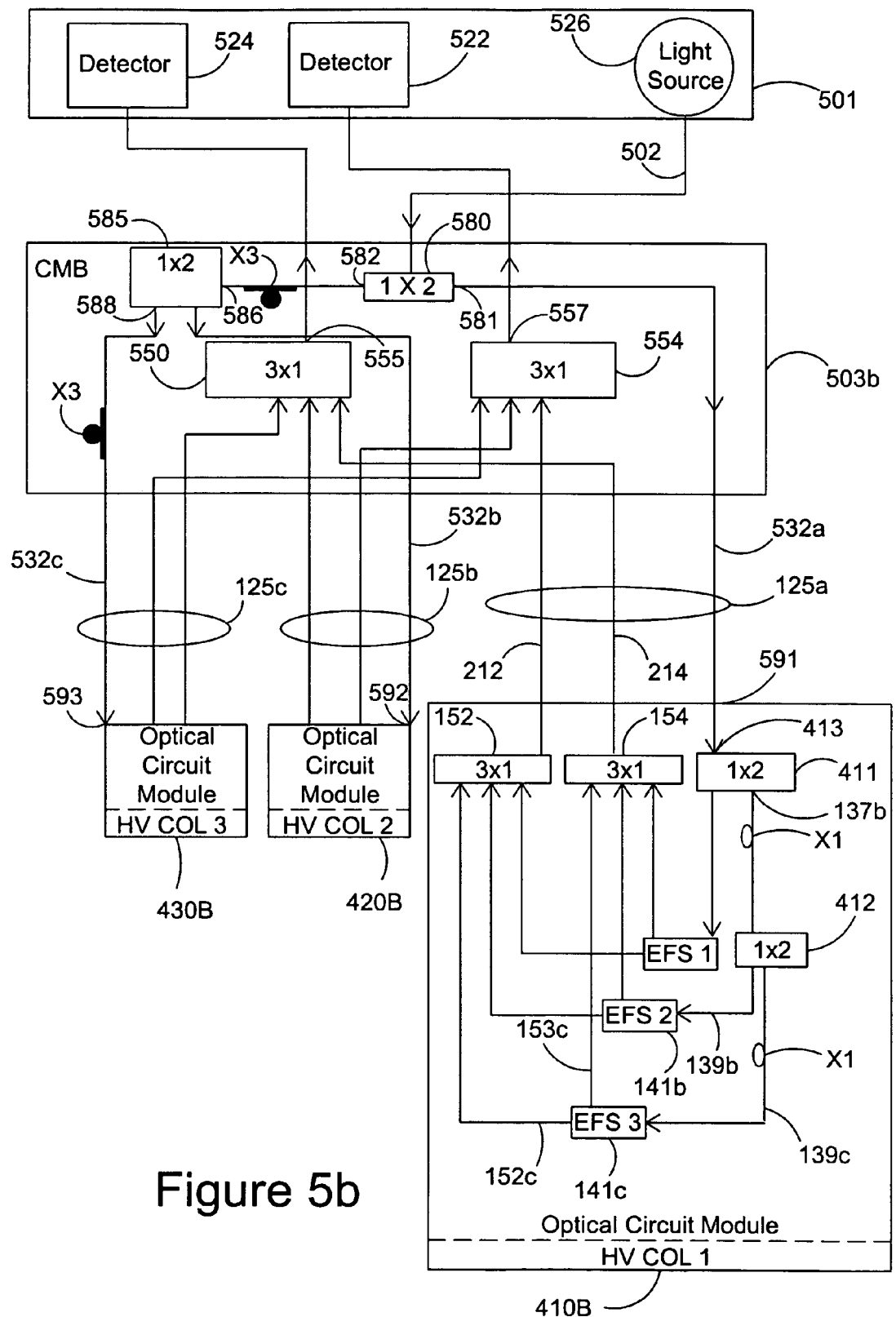

FIGS. 5*a* and 5*b* are schematic block diagrams of a voltage sensing system for a three-phase power line system employing another embodiment of the system and method of the present invention—two configurations of a 9-time-slot time-division multiplexed voltage sensor. FIGS. 5*a* and 5*b* have voltage sensors associated with the insulator columns similar to those described with reference to FIGS. 4*a* and 4*b*, respectively, where each voltage sensor associated with an insulator column receives an optical pulse through a single input, 135 or 413, and each voltage sensor provides a pair of polarization specific optical output signals from a pair of 3×1 combiners, 162 and 164, respectively.

As illustrated in FIGS. 5*a* and 5*b*, both the control room hardware 501, and the cable management box 503*a* and 503*b*, respectively, differ from that of FIGS. 4*a* and 4*b*. Specifically, control room hardware 501 is configured to have a single light source 526 for providing light pulses to each voltage sensor 510A, 520A, and 530A, and only a pair of detectors 522 and 524 to process the information from all of the voltage sensors associated with each of the insulator columns. The voltage sensors of FIG. 5*a* are substantially identical to those already described as those of FIG. 4*a*, and the voltage sensors of FIG. 5*b* being substantially identical to those already described as those of FIG. 4*b*.

As depicted in FIG. 5*a*, control room hardware 501 includes a 1×3 splitter 570 for receiving a single light source pulse from light source 526 through optical fiber 502, which in turn is directed to the three voltage sensors through optical fibers having selected delay lines therewith. As illustrated, voltage sensor 510A receives a light pulse at input 591 from a first output 572 of the 1×3 splitter 570 and optical fiber 532*a* of known length Lm, voltage sensor 520A receives a light pulse at input 592 through an output 574 thereof and optical fiber 532*b* of known length Lm, plus a delay line having a value X3, and voltage sensor 530A receives a light pulse at input 593 through an output 576 thereof and an optical fiber 532*c* of known length ~Lm plus a delay line having a value X6 having twice the value of X3.

In accordance with configuration as just described with reference to FIGS. 5*a*, each of the optical circuits associated with their respective voltage sensors receives an optical pulse separated in time in relationship to the selected value of the delay lines X3 and X6. Accordingly, each EFS sensor of all voltage sensors receives an interrogation optical pulse at differing times—9 specific successive times. This is so since the pulse delay circuits of each voltage sensor applies pulses to the individual EFS sensors at differing times in response to a received pulsed light wave (135), derived from the input primary pulsed light wave, and that each of the voltage sensors receives a portion of the primary pulsed light wave, at mutually exclusive successive times.

Further, cable management box 503*a* includes two receiving 3×1 optical signal combiners 552 and 554 for receiving corresponding signals of the same EFS sensor polarization specific outputs from each of the signal combiners 162 and 164, respectively, associated with each of the voltage sensors 510A, 520A, and 530A. In turn, the outputs 555 and 557 of each of the combiners 552 and 554, respectively, are routed to the control room hardware 501, and specifically detectors 522 and 524. In this scenario, the cable management box 503*a* may be located or associated with one of the insulator columns.

An alternate arrangement for the cable management box 503*a* depicted in FIG. 5*a* is designated 503*b* in FIG. 5*b* where a 1×2 splitter 580 is employed to produce a pair of light waves at outputs 581 and 582. Splitter output 581 is coupled directly to the light wave receiving input 591 of the voltage sensor 510B associated with one of the insulator columns. Splitter output 582 is coupled to a receiving input 586 of another 1×2 splitter 585 through a delay line X3. Splitter 585 includes a first output 587 which is coupled to the light wave receiving input 592 of another voltage sensor, 520B, and a second output 588 is coupled to the light wave receiving input 593 of another voltage sensor, 530B, through another delay line X3. Like the cable management box 503*a*, each of the voltage sensors receives an input light wave at differing times in relation to initiating pulse from source 526.

In the exemplary embodiments of FIGS. 5*a* and 5*b*, the control room hardware 501 may be implemented by way of one LED light source 526 in the order of 200 microwatts, and generates a light pulse width of 3 seconds, and have a pulse repetition rate of 30 seconds. Further, in the exemplary embodiment of FIG. 5*a*, the length of the delay lines X1, X2, X3, and X6 may be in the order of 600 m, 1200 m, 2000, and 4000, respectively. In the exemplary embodiment of FIG. 5*b*, the length of the delay lines X1, and X3 may be in the order of 600 m and 2000, respectively.

The configuration as just described is such that each optical circuit of each voltage sensor includes only one input fiber connection for receiving an optical pulse, and two output fiber connections for outputting the two polarization specific optical output signals from the three EFS sensors associated therewith. Control room hardware 501 needs only one output fiber connection for supplying a primary output pulsed light wave, and two input fiber connections for receiving the two polarization specific optical signals from the cable management box 503 derived from the nine EFS sensors associated with the three voltage sensors—one associated with each insulator column—through the pair of optical combiners 552 and 554.

Figure 6:
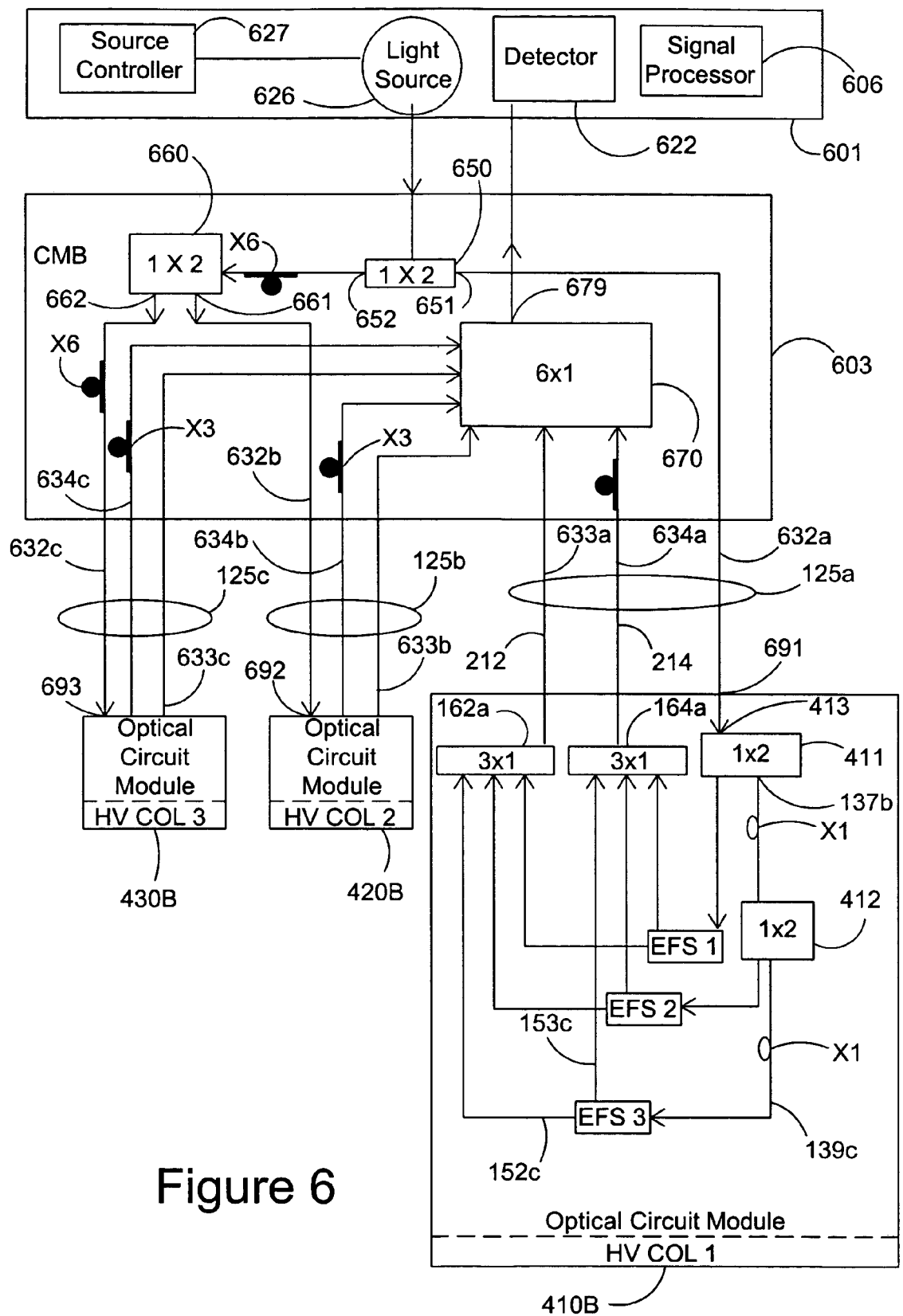
FIG. 6 is a schematic block diagram of an embodiment of the present invention illustrating an 18-time-slot time division multiplexed voltage sensing system for a three-phase power line.

FIG. 6 is a schematic block diagram of a voltage sensing system for a three-phase power line system employing another embodiment of the system and method of the present invention—an 18-time-slot time division multiplexed voltage sensing system. The voltage sensors associated with each of the insulator columns, 610, 620, and 630 may be similar to those already described with reference to FIGS. 4*a* and 4*b*, where each voltage sensor associate with an insulator column receives an optical pulse through a single input designated 691, 692, and 693 respectively (inputs 135 or 413 in FIGS. 4*a* and 4*b* respectively), and where each voltage sensor provides a pair of polarization specific optical output signals from a pair of 3×1 multimode combiners, 162 and 164, respectively.

In FIG. 6, the control room hardware 601 and the cable management box 603 differ from that of FIGS. 4*a* and 4*b*. The arrangement of FIG. 6 is such that only one light transmitting output is required to provide light wave pulses to each of the voltage sensors, and only requires one light receiving input from the cable management box 603. Specifically, control room hardware 601 like that of control room hardware 501, is configured to have a single light source 626 for providing light pulses to each voltage sensor 610, 620, and 630, and single detector 622 and single signal processor 606 to process the information from all of the voltage sensors associated with each of the insulator columns. However, it should be noted that source controller 627 may differ from that of source controller 527 in providing an appropriate pulse width and duty cycle in order to achieve the 18 time slot multiplexed system, and signal processor 606 is configured to appropriately process 18 discrete light wave pulses—6 pulses from each of three voltage sensors corresponding to two polarization specific light wave outputs from each of three electric field sensors.

As illustrated in FIG. 6, cable management box 603 includes a pair of series connected outgoing 1×2 splitters 650 and 660 through a delay line X6 for receiving a single light source pulse from source 626, which in turn is directed to three voltage sensors 610, 620, and 630 having light receiving inputs 691, 692, and 693, respectively. As illustrated, voltage sensor 610 light receiving input 691 is coupled to one output 651 of splitter 650 through light conduit or optical fiber 632a, voltage sensor 620 light receiving input 692 is coupled to an output 661 of splitter 660 through light conduit 632b, and voltage sensor 630 light receiving input 693 is coupled to the other output 662 of splitter 660 through light conduit 632c having delay line X6. As should be recognized by those skilled in the art, proper choice of light conduit lengths 632a, 632b, and 632c is required—e.g., light conduit 632b includes a delay value X6 relative to conduit 632a, and light conduit 632c includes two delays X6 relative to light conduit 632a. Accordingly, a portion of the primary pulsed light wave from source 626 will arrive at the individual voltage sensors at substantially mutually exclusive times successively delayed by a time delay related to the value of delay line X6.

Further, the cable management box 603 includes one receiving 6×1 optical signal combiner 670 for receiving the pair of polarization specific outputs from each of the voltage sensors as previously described, and derived generally from signal combiners 162 and 164 of each voltage sensor associated with each insulator column. In turn, the output of the 6×1 optical signal combiner 670 is routed to the control room hardware 601. As before, in this scenario, the cable management box 603 may be located at one of the insulator columns.

As particularly illustrated in FIG. 6, one polarization specific output, for example the output of signal combiner 162, of each voltage sensor is coupled to a specific input of combiner 670 along light conduits 633a, 633b, and 633c, respectively. Similarly, the other polarization specific output, for example the output of signal combiner 164, of each voltage sensor is coupled to a specific input of combiner 670 along light conduits 634a, 634b, and 634c, respectively, which include an additional delay line X3 relative to the light conduits 633.

It should be appreciated that if each voltage sensor includes three optical sensors that are interrogated by an interrogator pulsed light wave at differing times derived from a portion of the primary pulsed light wave provided as an input to each voltage sensor, and that each voltage sensor receives a portion of the primary pulsed input light wave at differing times, the output of combiner 670 will be 18 discrete light wave pulses. Further, signal processor 606 may be configured to sequentially process a stream of pulses associated with an individual voltage sensor for driving the voltage intended to be measured in accordance with well established techniques as described in the aforementioned patents.

In an exemplary embodiment of the configuration as illustrated in FIG. 6, only one LED light source 626 in the order of 200 microwatts is needed, with a pulse repetition rate of 60 micro-seconds, 3 microseconds on and 57 microseconds off. Further, in an exemplary embodiment, the length of the delay lines X1, X3, and X6 are in the order of 600 m, 2000 m, and 4000 m, respectively.

While the present invention has been particularly shown and described with reference to the accompanying figures, it will be understood, however, that other modifications thereto are of course possible, all of which are intended to be within the true spirit and scope of the present invention. Various changes in form and detail may be made therein without departing from the true spirit and scope of the invention as defined by the appended claims.

More specifically it should be noted that in the preceding exposition the present invention has been described where each voltage sensor includes three optical sensors, specifically electric field sensors having two different polarization state outputs. It should of course be understood that one or more optical sensors may be employed, and in which the optical sensors may have any number of polarization or other optical characteristic outputs that may be signal processed in order to provide a measurement of the intended voltage or voltages—all of which are intended to be within true spirit and scope of the present invention. Further, it should be recognized that the number of time division slots is of course dependent upon the number of voltage sensors, the number of optical sensors in each voltage sensor, and the number of optical output characteristics of the associated optical sensors—two in the example where they are differing polarization states.

It should be recognized that the optical circuit possibilities and corresponding light conduit delays possibilities are endless. As just indicated; there may be fewer or more than 3 electric field sensors per voltage sensor; the chosen optical fibers and types of optical light wave delays can be various combinations of single-mode and multi-mode. The compromise between signal quality, cost, and ease of use will determine an optimum design. However, it should be recognized that practice of the present invention incorporating time division multiplexing of optical sensor signals may reduce cabling cost and complexity from a user's point of view and reduce electronics cost and volume.

The arrangement and choice of delay lines as illustrated in the exemplary embodiments have also a wide array of configurations. For example, with reference to FIG. 6, the 1×2 splitters may be connected in series without the delay X6 as illustrated, and an additional delay line X6 may be added to both optical conduits 632b and 632c in order to achieve the desired arrival of a pulse at each of the voltage sensors at each of the insulator columns at differing times. Further, it should be recognized that a light wave as used herein may be any electromagnetic wave including both the visible and non-visible spectrums.

As indicated just above, there are wide variety of time division multiplexed optical circuit configurations in accordance with the present invention so as to reduce optical fiber interconnects and or circuit processing techniques as desired. A few of such circuit configurations will now be described with reference to FIGS. 7a–c & 8, and may be combined and/or interchanged to achieve a desired circuit configuration and use of components.

Figure 7A:
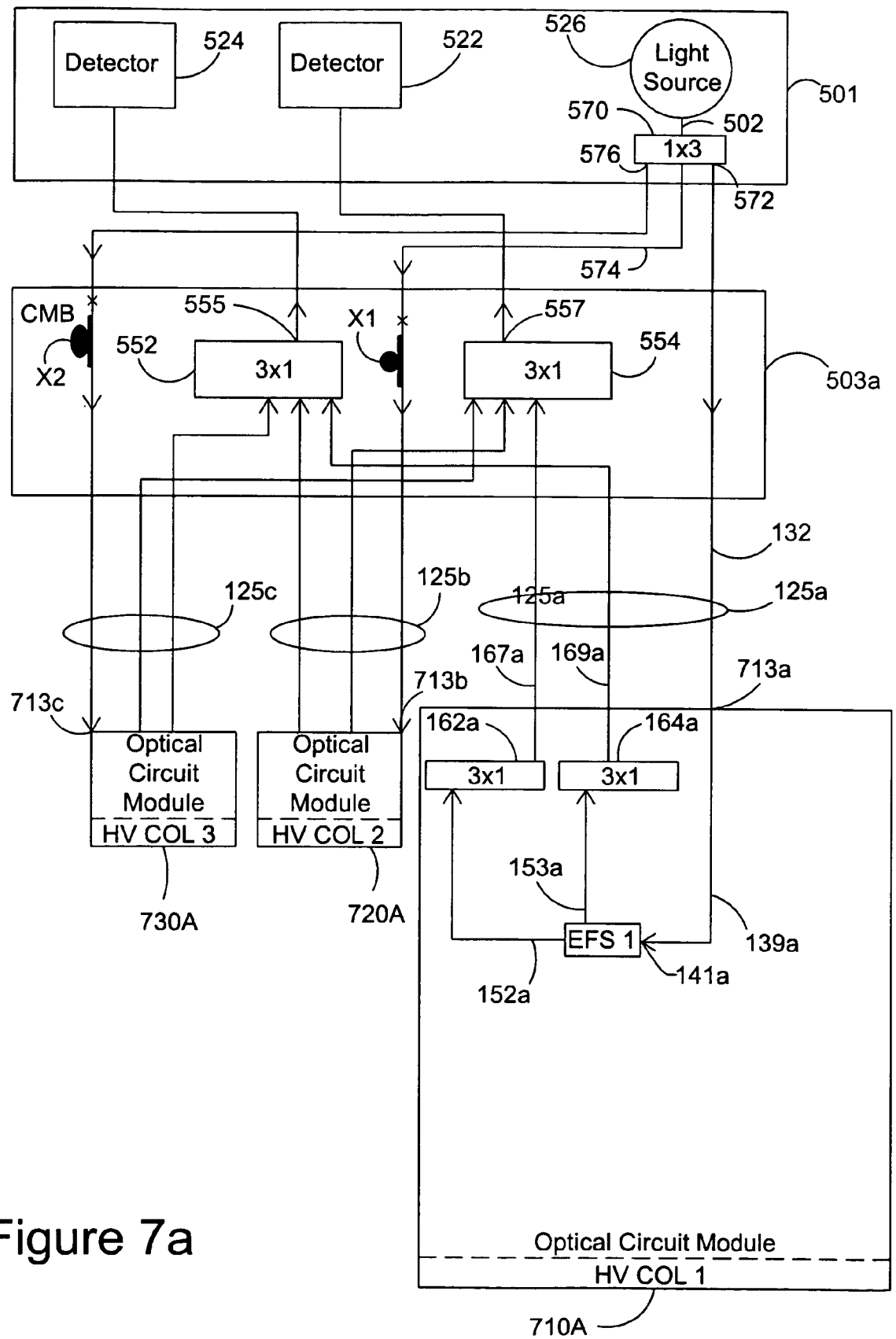
FIG. 7a is a schematic block diagram of a voltage sensing system for a three-phase power line system, where a power line voltage sensor associated with one high voltage insulator column employs a single optical electric field sensor individually interrogated by an optical signal by way of a single light source.

FIG. 7a illustrates the employment of single light source 526 for generating a primary pulsed light wave that is split by way of a 1×3 splitter 570. Optical circuit module 710A is illustrated having a single electric field sensor EFS-1 and having a light wave input means 713 coupled to one output of splitter 270 along light conduit or fiber 132. Optical circuit module 720A receives a pulsed light wave at input 713b coupled to another output of splitter 570 through a time delay X1, and optical circuit module 730A receives a pulsed light wave at input 713c coupled to another output of splitter 570 through a time delay X2—twice the value of X1. The outputs of the electric field sensor as before, like FIG. 5a are coupled to detectors 522 and 524.

Figure 7B:
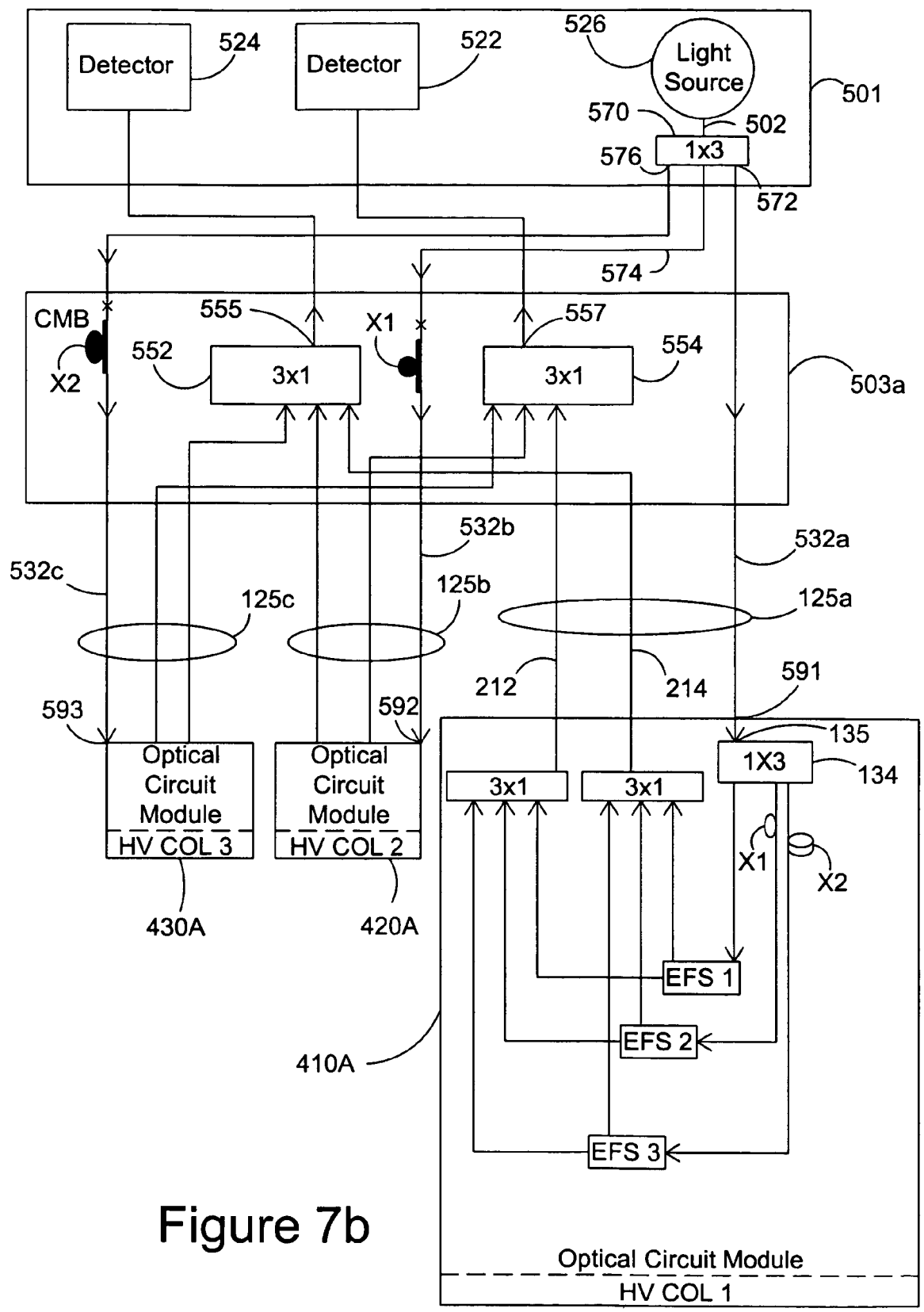
FIG. 7b is a schematic block diagram similar to FIG. 7a where multiple electric field sensors are employed.

FIG. 7b is similar to FIG. 7a where multiple electric field sensors are employed. Of Course, the 3×1 combiners of FIG. 7a are not necessary, but may be employed for transmitting other outputs from optical sensors.

Figure 7C:
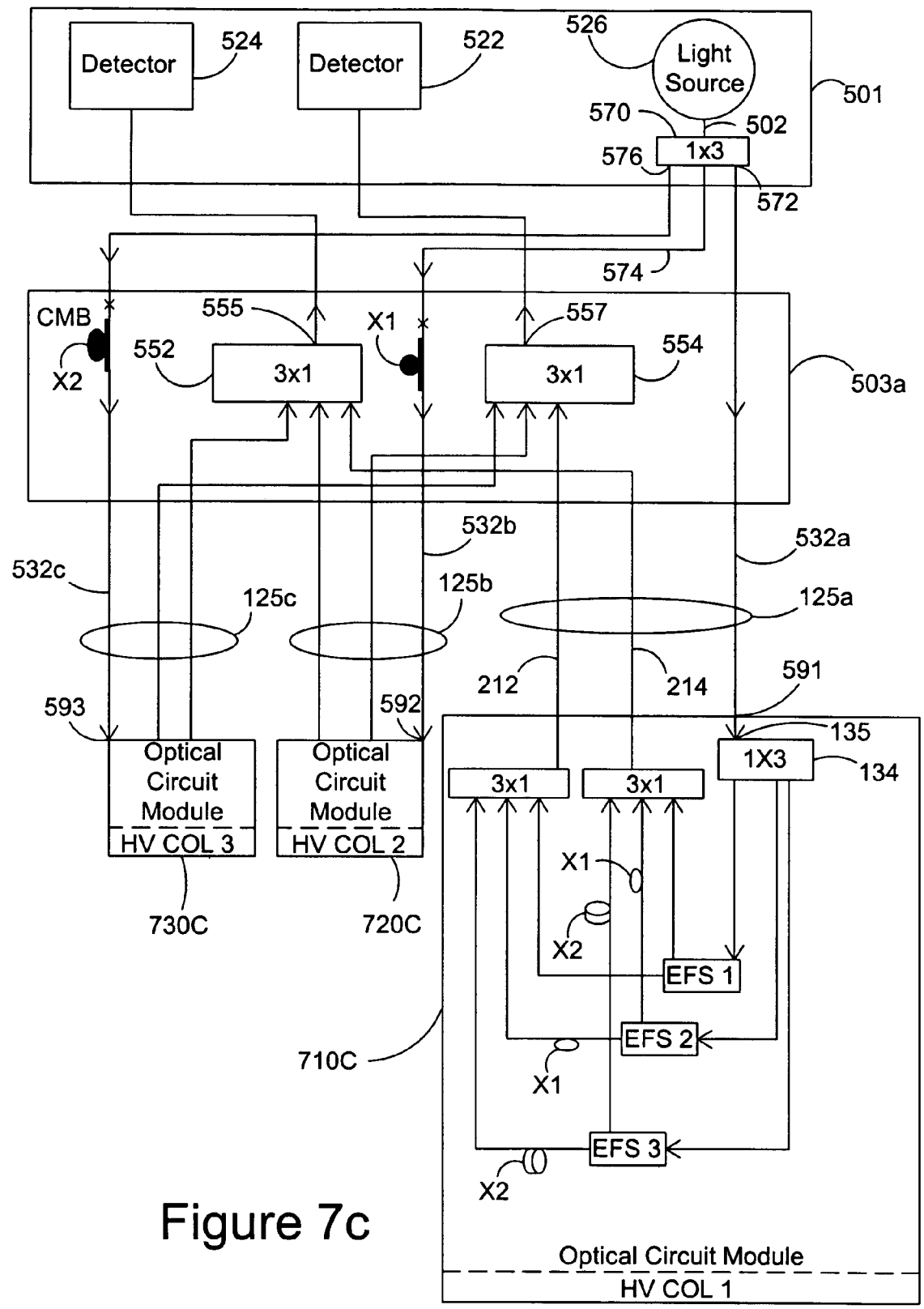
FIG. 7c is substantially FIG. 7a including time delays in the outputs of the electric field sensors before being combined by way of optical combiners.

FIG. 7c is alternate arrangement of FIG. 7b. FIG. 7c is substantially FIG. 7b including time delays in the outputs of the electric field sensors before being combined by way of optical combiners. As shown therein, signal delays of the interrogation light wave (FIG. 7b) are replace with an X1 time delay added to the outputs of EFS sensors of one polarization, and an X2 time delay—twice that of X1, for example, is added to the outputs of EFS sensors of the other polarization. It should be recognized that this alternate arrangement may be applied to any of the optical circuit arrangements described, particularly like those illustrated in FIGS. 4a and 4b, and the like.

Figure 8:
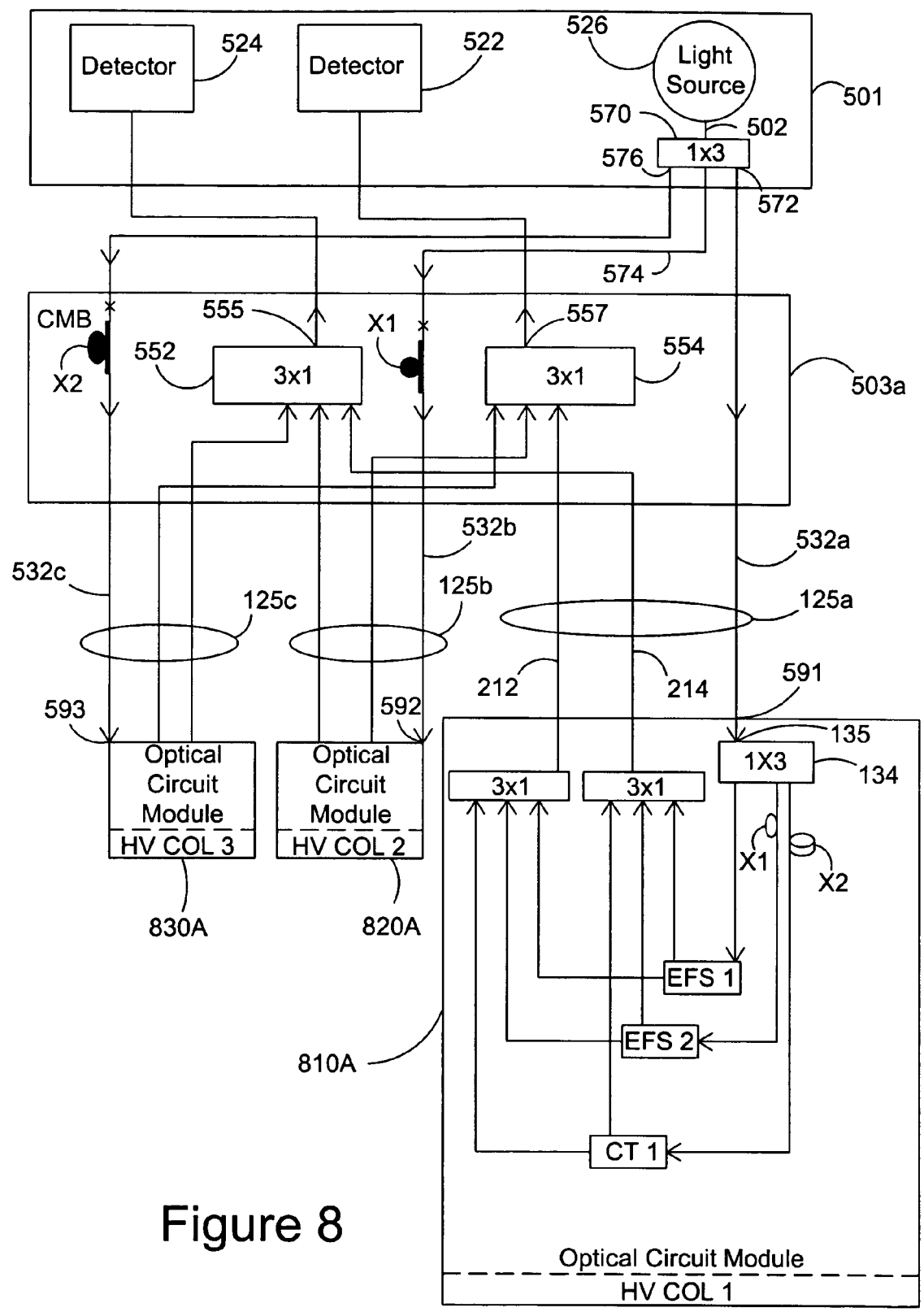
FIG. 8 is substantially FIG. 7b where one of the optical electric field sensors is replace by an optical current sensor.

FIG. 8 is substantially FIG. 7b where one of the optical electric field sensors is replace by an optical current sensor.

Figure 9:
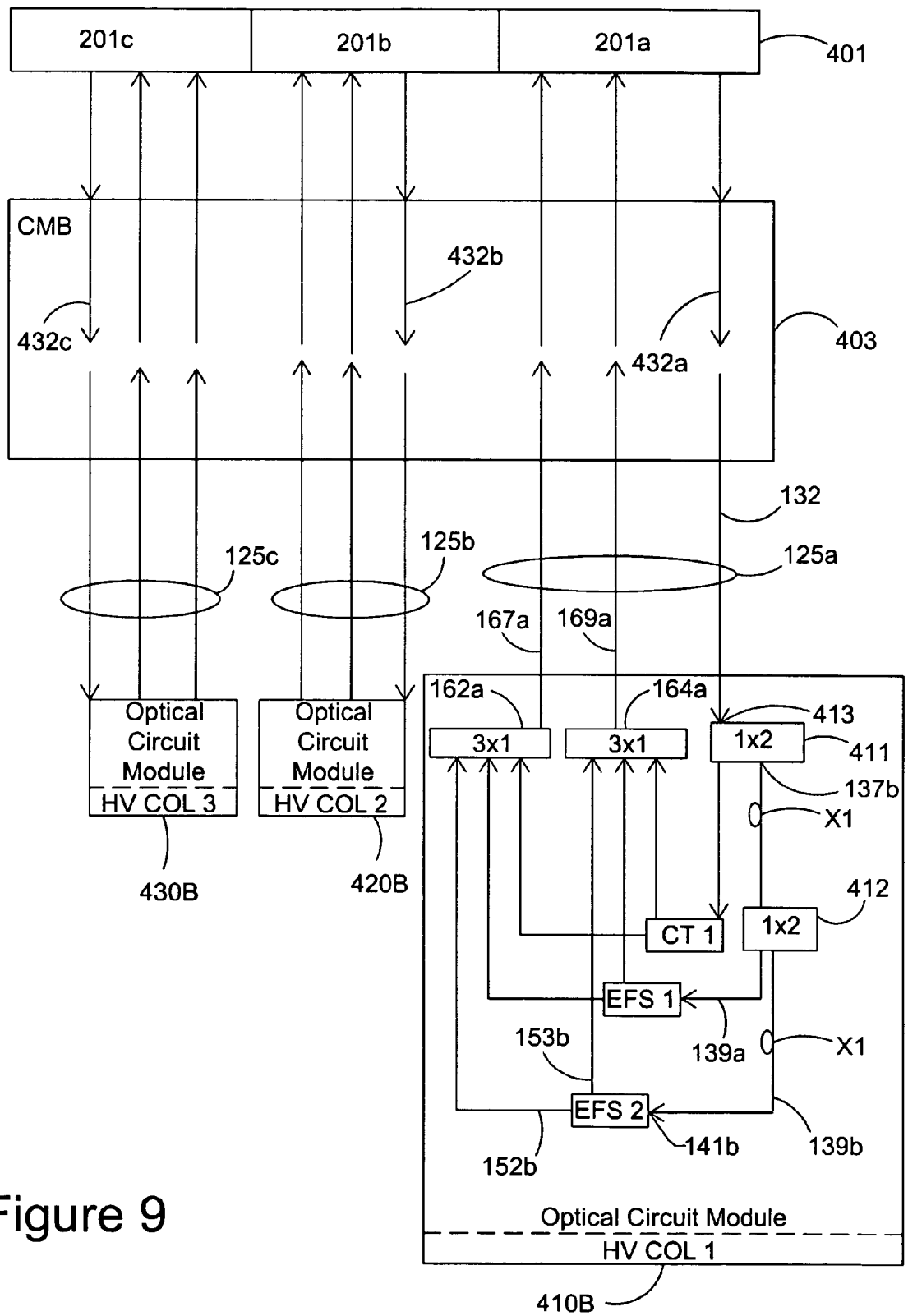
FIG. 9 is a schematic block diagram in accordance with the present invention where an optical current sensor includes an output light wave that exits along the same optical fiber as the input optical wave presented thereto, and an optical signal is derived by an optical coupler couple to the primary optical light wave fiber.

FIG. 9 is a schematic block diagram in accordance with the present invention where an optical current sensor includes an output light wave that exits along the same optical fiber as the input optical wave presented thereto, and an optical signal is derived by an optical coupler 945 couple to the primary optical light wave fiber 132, the output of which is coupled to detector 920. As illustrated the control room hardware 901 includes the optical coupler 945 and detector 940. It should be recognized however that the output of coupler could as well been directed to detector 522 if desired by way of additional optical circuitry in order to achieve the intended purpose.

As set forth in the accompany description of the invention, apparatuses and corresponding methods have been taught to achieve system for measuring voltage or current of a high voltage power line system employing the use of multiple optical sensors, particularly optical voltage or electric field sensors, and optical current sensors. While the present invention has been particularly shown and described with reference to the accompanying figures, it will be understood, however, that other modifications thereto are of course possible, all of which are intended to be within the true spirit and scope of the present invention. Various changes in form and detail may be made therein without departing from the true spirit and scope of the invention as defined by the appended claims. Specifically, as aforedescribed, optical circuit arrangements may be configured by way of many possibilities, all of which are intended to be within the true spirit and scope of the present invention

We claim:

1. A time division multiplexed optical voltage measuring system comprising:
   a light source for generating a primary pulsed light wave having a selected pulse width and duty cycle;
   an optical voltage sensing system module including,
      (i) a plurality of optical sensors, N, wherein each $n^{th}$ sensor includes,
         (a) a receiving input for receiving an interrogation light wave, and
         (b) at least one emitting output for emitting a first sensor output light wave having optical characteristics derived from said interrogation light wave and in response to any sensed electric field thereat, and
      where said plurality of optical sensors are spatially located at a location where a voltage is intended to be measured, and
      where said voltage intended to be measured is a function of the sensor output light waves from selected ones of the N optical sensors,
      (ii) an optical circuit arrangement having,
         an input for receiving a module specific pulsed light wave derived from said primary pulsed light wave, and
         arranged such that each of said N optical sensors receives an interrogation pulsed light wave derived from said module specific pulsed light wave at differing times, and
      (iii) at least a first optical wave combiner having at least N inputs, where an $n^{th}$ input is coupled to a corresponding emitting output of an nth sensor for receiving a sensor output light wave therefrom;
   at least a first detector having,
      a detector input coupled to said first optical wave combiner output, and
      a detector output for producing an electrical detector output signal representative of any light at its input; and
   an electrical signal processor responsive to said electrical detector output signal for deriving said voltage intended to be measured as a function of received sensor output light waves from said plurality of sensors.

2. The time division multiplex optical voltage measuring system of claim 1 wherein said optical circuit arrangement includes at least a first optical splitter having an input for receiving said module specific pulsed light wave, and having a plurality of outputs for providing pulsed secondary light waves from which said interrogation pulsed light waves are derived.

3. The time division multiplex optical voltage measuring system of claim 2 where a first output of said first optical splitter is coupled to an input of a first one of said N optical sensors through a first light conduit of known length, and a second output of said first optical splitter is coupled to an input of a second one of said N optical sensors through a second light conduit of known length greater than said first light conduit so as to impose a fixed delay in the arrival of light pulses at the inputs of said first and second optical sensors.

4. The time division multiplex optical voltage measuring system of claim 3 where a third output of said first optical splitter is coupled to an input of a third one of said N optical sensors through a third light conduit of known length greater than said second light conduit so as to impose a fixed delay in the arrival of light pulses at the input of said third optical sensor relative to said second optical sensor.

5. The time division multiplexed optical voltage measuring system of claim 2 where:

a first output of said first optical splitter is coupled to an input of a first one of said N optical sensors through a first light conduit of known length;

a second output of said first optical splitter is coupled to an input of a second optical splitter through a second light conduit of known length greater than said first light conduit so as to impose a first fixed delay; and a first output of said second optical splitter is coupled to an input of a second one of said N optical sensors through a third light conduit of known length, and a second output of said second optical splitter is coupled to an input of a third one of said N optical sensors through a fourth light conduit of known length greater than said third light conduit so as to impose a fixed delay in the arrival of light pulses at the inputs of said second and third optical sensors relative to a light pulse at said first optical sensor.

6. A time division multiplexed optical voltage measuring system for a multi-phase high voltage power line system comprising:

a light source for generating a primary pulsed light wave having a selected pulse width and duty cycle;

a plurality of voltage sensing system modules, J, where a $j^{th}$ one is adapted to measure a $j^{th}$ voltage measure and related to said multi-phase system, where each of said voltage sensing modules includes, (i) a plurality of optical sensors, N, wherein each $n^{th}$ sensor includes,
   (a) a receiving input for receiving an interrogation light wave, and
   (b) at least one emitting output for emitting a first sensor output light wave having optical characteristics derived from said interrogation light wave and in response to any sensed electric field thereat, and where said plurality of optical sensors are spatially located at a location where a voltage is intended to be measured, and where said voltage intended to be measured is a function of the sensor output light waves from selected ones of the N optical sensors, (ii) an optical circuit arrangement having,
   an input for receiving a module specific pulsed light wave derived from said primary pulsed light wave, and occurring at a different time than that received by the other ones of said voltage sensing system modules, and
   arranged such that each of said N optical sensors receives an interrogation pulsed light wave derived from said module specific pulsed light wave at differing times, and (iii) at least a first optical wave combiner having at least N inputs, where an $n^{th}$ input is coupled to a corresponding emitting output of an nth sensor through a corresponding nth light conduit for receiving a sensor output light wave therefrom, and an output for emitting any light received at its inputs thereof;

at least a first detector having,
   a detector input coupled to said first optical wave combiner output of each of said voltage sensing modules, and
   a detector output for producing an electrical detector output signal representative of any light at its input; and an electrical signal processor responsive to said electrical detector output signal for deriving said voltage intended to be measured at each location of said voltage sensing modules as a function of received sensor output light waves from said plurality of sensors associated with a specific one module.

7. A time division multiplex optical voltage measuring system of claim 6 further including an optical signal management router including an optical circuit arrangement for providing each of said plurality of voltage sensing modules with a module specific pulsed light wave derived from said primary pulsed optical wave such that each of said voltage sensing modules receives their respective module specific pulsed light wave at differing times.

8. A time division multiplexed optical voltage measuring system of claim 7 wherein said optical signal management router includes at least one optical splitter having,
   (i) an input for receiving a signal derived from said primary pulsed light wave,
   (ii) a first output coupled to the input of a first one of said plurality of voltage sensing system modules for receiving a module specific pulsed light wave through a first light conduit, and
   (iii) a second output coupled to the input of a second one of said plurality of voltage sensing system modules for receiving a module specific pulsed light wave through a second light conduit including an imposed fixed delay X1 for delaying the arrival of light pulses at the inputs of said first and second voltage sensing system modules relative to each other.

9. A time division multiplexed optical voltage measuring system of claim 7 wherein said optical signal management router includes:
   at least first and second optical splitters where,
      said first optical splitter includes,
         (i) an input for receiving a signal derived from said primary pulsed light wave,
         (ii) a first output coupled to the input of a first one of said plurality of voltage sensing system modules through a first light conduit for receiving a module specific pulsed light wave, and
         (iii) a second output coupled to an input of said second optical splitter through an imposed first time delay; and
      said second optical splitter includes,
         (i) a first output coupled to the input of a second one of said plurality of voltage sensing system modules through a second light conduit for receiving a module specific pulsed light wave, and
         (iii) a second output coupled to the input of a third one of said plurality of voltage sensing system modules through a third light conduit for receiving a module specific pulsed light wave.

10. The time division multiplex optical voltage measuring system of claim 6 further including an optical signal management router including at least one optical combiner having,
   (i) M inputs, where each $m^{th}$ input is coupled to the output of said first optical combiner associated with a mutually exclusive one of said plurality of voltage sensing system modules,
   (ii) an output coupled to said first detector input.

11. The time division multiplexed optical voltage measuring system of claim 10 wherein:
   each of said optical sensors includes a second emitting output for emitting a second sensor output wave having different optical characteristics derived from said interrogation light wave and in response to any sensed electric field thereat in relation to said first sensor output wave;

said voltage sensing module includes a second optical wave combiner having at least N inputs, where an $n^{th}$ input is coupled to a corresponding second emitting output of an nth sensor through a corresponding nth light conduit for receiving said second sensor output light wave therefrom, and an output for emitting any light received at its inputs thereof;

said optical signal management router further includes a second optical combiner having, (i) Q inputs where each $q^{th}$ input is coupled to a mutually exclusive output of a said second optical combiner associated with a respective one of said plurality of voltage sensing system modules, and (ii) an output; and said optical voltage measuring system includes a second detector having, a detector input coupled to said second optical wave combiner output of optical signal management router, and a detector output for producing an electrical detector output signal representative of any light at its input.

12. The time division multiplexed optical voltage measuring system of claim 10 wherein:

each of said optical sensors includes a second emitting output for emitting a second sensor output wave having different optical characteristics derived from said interrogation light wave and in response to any sensed electric field thereat in relation to said first sensor output wave;

said voltage sensing module includes second optical wave combiner having at least N inputs, where an $n^{th}$ input is coupled to a corresponding second emitting output of an nth sensor through a corresponding nth light conduit for receiving said second sensor output light wave therefrom, and an output for emitting any light received at its inputs thereof;

said optical signal combiner of said optical signal management router further includes Q additional inputs where each $q^{th}$ input is coupled to the output of said second optical combiner associated with a mutually exclusive one of said plurality of voltage sensing system modules; and where said optical signals associated with each signal combiner of each voltage sensing module arrive at the inputs of said optical signal combiner of said router at differing times.

13. The time division multiplex optical voltage measuring system of claim 12 wherein said signal processor selectively derives each voltage measurement associated with each voltage sensing modules as a function of said electrical detector output signal.

14. A time division multiplex optical voltage measuring system for a multi-phase high voltage power line system for measuring the voltage associated with a transmission line of the multi-phase high voltage power line system comprising:

a light source for generating a primary pulsed light wave having a selected pulse width and duty cycle;

a plurality of voltage sensing system modules, J, each having an optical sensing system structure including, (i) a plurality of optical sensors, N, wherein each $n^{th}$ sensor includes, (a) a receiving input for receiving an interrogation light wave, and (b) at least one emitting output for emitting a first sensor output light wave having optical characteristics derived from said interrogation light wave and in response to any sensed electric field thereat, and where said plurality of optical sensors are spatially located at a location where a voltage is intended to be measured, and where said voltage intended to be measured is a function of the sensor output light waves from selected ones of the N optical sensors, at least a first module optical wave splitter having, an input adapted to be coupled to a light conduit for receiving a module specific pulsed light wave, and a plurality of outputs for passing a portion of said received module specific pulsed light wave, an input optical circuit arrangement including, a plurality of sensor light conduits, N, each having, an output end thereof coupled to a receiving input of a mutually exclusive one of the N plurality of sensors, an input end adapted to receive at least a portion of said module specific pulsed light wave from said first module optical wave splitter, and said input optical circuit arrangement arranged such that a portion of said module specific pulsed light wave is received at said receiving input of each of said N optical sensors at differing times, and at least a first optical wave combiner having, at least N inputs, where an nth input is coupled to the emitting output of a corresponding nth sensor, and an output for passing therefrom any received light waves from said optical sensors;

an optical signal management router operative for routing optical signals to and from the plurality of voltage sensing system modules, the optical signal management router including, a source dividing optical circuit having, at least a first optical wave splitter having, an input adapted to be coupled to said light source for receiving said primary pulsed light wave, and a plurality of outputs, M, for passing from each of said M outputs a portion of said primary pulsed light wave, and an optical circuit arrangement for coupling an output to said optical wave splitter of said router to each of input of said voltage sensing modules such that each module specific pulse light waves arrives at differing times relative to each other;

at least a first optical wave combiner having, a plurality of inputs, J, where a corresponding $j^{th}$ one is coupled to a mutually exclusive output of said first combiner of said voltage sensing system modules for receiving light waves therefrom, and an output for passing therefrom any received light waves at said J inputs thereof;

at least a first detector having, a detector input coupled to said output of said first optical wave combiner of said router, and a detector output for producing an electrical detector output signal representative of any light at its detector input; and an electrical signal processor responsive to said electrical detector output signal for deriving said voltage intended to be measured and associated with each of said voltage sensing system modules.

15. A time division multiplexed optical voltage measuring system comprising:

at least one light source for generating a primary pulsed light wave having a selected pulse width and duty cycle;

an optical sensing system circuit including,
- (i) a plurality of optical sensors, N, wherein each $n^{th}$ sensor is configured to sense a desire electromagnetic parameter, and where each sensor configured to,
  - (a) receive an interrogation light wave, and
  - (b) emit at least a first sensor output light wave having optical characteristics derived from said interrogation light wave and in response to a selected electromagnetic intended to be sensed, and
- (ii) an optical wave splitting circuit arrangement having,
  - at least one input for receiving a pulsed light wave derived from said primary pulsed light wave, and arranged such that each of said N optical sensors receives an interrogation pulsed light wave derived from said primary pulsed light wave, and
- (iii) at least a first optical wave comber having at least N inputs, where an $n^{th}$ input is arranged to correspondingly receive said at least a first sensor output wave associated with said $n^{th}$ sensor, and
- (iv) an optical wave delay circuit arrangement such that said first optical wave combiner output emits said at least a first sensor output wave associated with each of said N sensors at differing times;

at least a first detector having,
- a detector input coupled to said first optical wave combiner output, and
- a detector output for producing an electrical detector output signal representative of any light at its input; and an electrical signal processor responsive to said electrical detector output signal for deriving said electromagnetic parameter intended to be measured as a function of received sensor output light waves from said plurality of sensors.

16. The time division multiplex optical voltage measuring system of claim 2 where a first output of said first optical splitter is coupled to an input of a first one of said N optical sensors through a first light delay means, and a second output of said first optical splitter is coupled to an input of a second one of said N optical sensors through a second light delay means imposing a delay greater than said first light delay means so as to impose a fixed delay in the arrival of light pulses at the inputs of said first and second optical sensors.

17. The time division multiplex optical voltage measuring system of claim 16 where a third output of said first optical splitter is coupled to an input of a third one of said N optical sensors through a third light delay means greater than said second light delay means so as to impose a fixed delay in the arrival of light pulses at the input of said third optical sensor relative to said second optical sensor.

18. The time division multiplexed optical voltage measuring system of claim 2 where:
- a first output of said first optical splitter is coupled to an input of a first one of said N optical sensors through a first light delay means;
- a second output of said first optical splitter is coupled to an input of a second optical splitter through a second light delay means so as to impose a second fixed delay; and
- a first output of said second optical splitter is coupled to an input of a second one of said N optical sensors through a third light delay means, and a second output of said second optical splitter is coupled to an input of a third one of said N optical sensors through a fourth light delay means greater than said third light delay means so as to impose a fixed delay in the arrival of light pulses at the inputs of said second and third optical sensors relative to a light pulse at said first optical sensor.

* * * * *